(12) United States Patent
LiCausi et al.

(10) Patent No.: US 8,476,137 B1
(45) Date of Patent: Jul. 2, 2013

(54) METHODS OF FINFET HEIGHT CONTROL

(75) Inventors: Nicholas LiCausi, Watervilet, NY (US); Jeremy Wahl, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/370,722

(22) Filed: Feb. 10, 2012

(51) Int. Cl.
*H01L 21/336* (2006.01)

(52) U.S. Cl.
USPC ........... 438/270; 438/156; 438/212; 438/268; 438/286; 257/296; 257/301; 257/328; 257/E29.321; 257/E21.384

(58) Field of Classification Search
None
See application file for complete search history.

(56) References Cited

U.S. PATENT DOCUMENTS

| | | | | |
|---|---|---|---|---|
| 7,566,619 B2 * | 7/2009 | Ahn et al. | ...................... | 438/268 |
| 7,588,985 B2 * | 9/2009 | Kim | ............................... | 438/270 |
| 7,863,137 B2 * | 1/2011 | Lee et al. | ...................... | 438/270 |
| 7,879,659 B2 * | 2/2011 | Wilson et al. | .................. | 438/156 |
| 8,084,845 B2 * | 12/2011 | Torek et al. | .................... | 257/618 |
| 2005/0186746 A1 * | 8/2005 | Lee et al. | ...................... | 438/300 |

* cited by examiner

*Primary Examiner* — Zandra Smith
*Assistant Examiner* — Khanh Duong
(74) *Attorney, Agent, or Firm* — Williams, Morgan & Amerson, P.C.

(57) ABSTRACT

Disclosed herein are methods for better variable height control of FinFET patterned fins. In one example, the method includes forming a layer on a substrate, patterning that layer to create trenches, and forming a common stack material in the trenches. Next, a pFET masking material is formed over a portion of the structure, and an nFET channel material is formed in the unmasked trenches. The pFET masking material is removed and an nFET masking material is formed over the portion of the structure that includes the nFET channel material, and a pFET channel material is formed in the unmasked trenches. Next, the unmasked patterned material is made flush with the pFET channel material, thereby creating a difference in height with the masked pattern material. Finally, the nFET masking material is removed and the patterned layer is recessed to expose pFET and nFET channel material fin structures of differing heights.

23 Claims, 27 Drawing Sheets

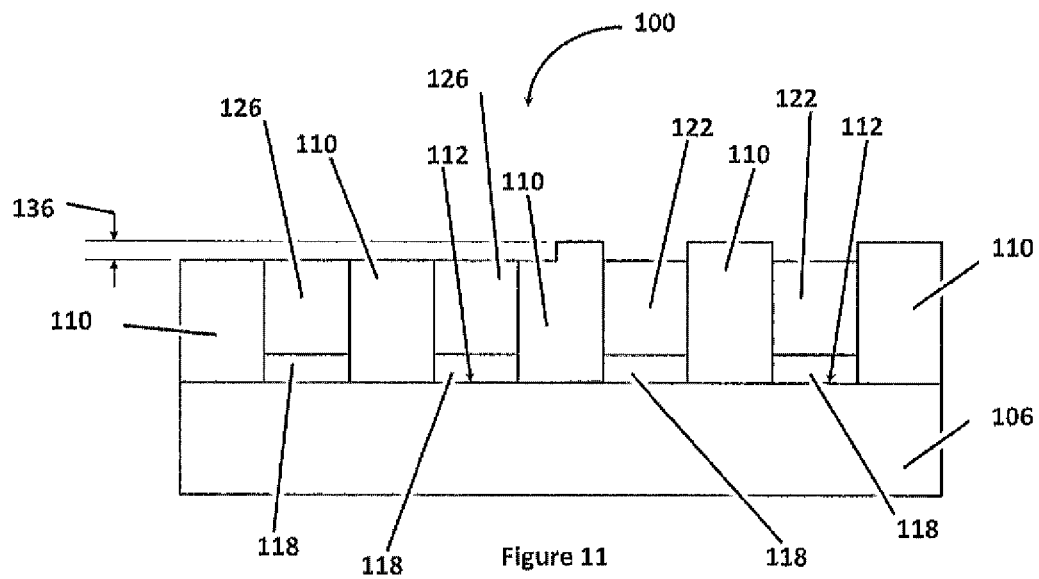
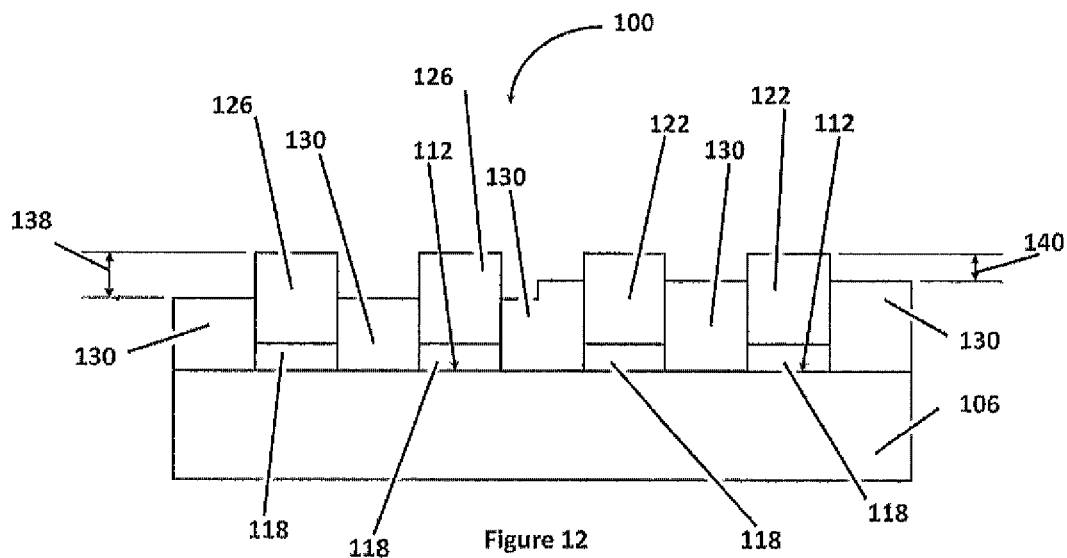

METHODS OF FINFET HEIGHT CONTROL

BACKGROUND OF THE INVENTION

1. Field of the Invention

Generally, the present invention relates to the manufacturing of sophisticated semiconductor devices, and, more specifically, to various methods of improved fabrication and variable height control of structures used in integrated circuit devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Numerous processing operations are performed in a very detailed sequence, or process flow, to form such integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. Device designers have been very successful in improving the electrical performance capabilities of transistor devices, primarily by reducing the size of or "scaling" various components of the transistor, such as the gate length of the transistors. As size is reduced, the control of the height of fin structures on bulk substrates is difficult. Furthermore, existing methods make a CMOS flow difficult when attempting to use alternative channel materials for nFET and pFET. Conventional FinFET fin formation utilizes a hard mask and etching to etch away surrounding area, creating the fin. The trenches on each side of the fin are then filled with oxide, and excess oxide is removed with chemical mechanical planarization (CMP) and/or oxide etching. FinFET devices are currently only available in one height format. This does not allow the flexibility or control of device widths that is currently available to designers with planar CMOS structures. Active fin height is the dominant control of the effective FinFET device width. This means that device width can only be an integer multiplier of 1 fin "width" (height×2+width). In order to accommodate more granular device widths, various active fin heights or having different amounts of silicon (Si) exposed (active Si) above the oxide are necessary.

The present disclosure is directed to various methods of fabricating features in an integrated circuit structure, using an improved variable fin height control technique. These techniques can be used in CMOS circuits with alternative channel materials or traditional materials.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods for better variable height control of the FinFET patterned fins. In one example, the method includes forming a layer on a substrate, patterning that layer to create trenches, and then forming a common stack material in the trenches. Next, a pFET masking material is formed over a portion of the structure, and then an nFET channel material is formed in the unmasked trenches. The pFET masking material is then removed and an nFET masking material is formed over the portion of the structure that includes the nFET channel material. Next a pFET channel material is formed in the unmasked trenches. Next, the unmasked patterned material is made flush with the pFET channel material, thereby creating a difference in height with the masked pattern material. Finally the nFET masking material is removed and the patterned layer is recessed to expose pFET channel material and nFET channel material fin structures of differing heights.

In other illustrative examples the common stack material is formed on the substrate prior to forming the layer used to create trenches. In other embodiments the method includes the different step of controlling the variable fin height by epitaxial growth height.

One embodiment of this invention begins by depositing or growing an insulator, such as an oxide material, for example, silicon dioxide. This oxide material is then patterned and etched to open windows or trenches to the substrate where fins will be grown. If a common channel material (for example, Si:2% C) is desired, it is epitaxially grown in the windows. Then, some windows are covered and one pole of fins (for example nFET) are epitaxially grown in the exposed windows (with Si as an example). The previously masked windows are opened and the newly formed fins are masked. The alternate channel material is then grown (i.e., germanium (Ge) for pFETs). The fins are grown to two different heights. The masked fins are then un-masked and the silicon dioxide is recessed to allow the fins to protrude from the oxide at their different heights. The existing fin formation flow requires approximately 17 steps. This flow could require less than 12 steps. This invention also allows for different channel materials for NMOS and PMOS, or can also allow for different areas, such as logic and SRAM. Other embodiments of the invention can include masking areas of library cells.

This invention also allows the FinFET channels to be produced using different channel material (for example, Ge for pFET and Si for nFET). This invention is extendable to group III-V semiconductor materials. Instead of a Si substrate, an InP buffer could be used as the "substrate." Some embodiments of this flow do not need a hard mask to etch the fins, which makes removal of the hard mask unnecessary. Initial oxide patterning can be done using various methods, such as conventional lithography, extreme ultraviolet lithography (EUV), or sidewall image transfer (SIT). This invention takes two primary paths to achieve variable height control for the fin devices. Silicon fins are currently created using an etch process. This invention allows for variable recess of the local isolation surrounding the fin structure. By controlling the recess amount, the amount of exposed fin may be tailored to different fin heights or effective device widths. An alternative method utilizes epitaxially grown fins. Silicon or alternative channel material can be selectively, epitaxially grown from the substrate forming fins. By masking some fin trenches, only a subset of fins may be grown at a time. Each subset (pFET vs. nFET, or similar channel vs. similar channel) can be grown to a specified height within the insulator trench. The insulator can then be blanket recessed to a uniform height with different fin heights exposed. Each subset of fins can also have the local isolation recessed independently of each other prior to removing the mask layers. Advantages of this invention include the ability to control fin height by groups. This allows for more variation of effective device widths, which is a great advantage to designers. This also allows for the use of high quality thermal oxide as a local isolation for epitaxially grown versions. The local isolation recess variation method included in this invention allows for integration with methods of etching the substrate to form the fins. This invention can also use alternative channel materials.

Another option is to introduce an initial difference in total Si fin height so that a uniform oxide recess exposes more Si for the taller fins than the shorter fins. This initial difference would be formed by etching some of the fins back prior to isolation oxide deposition.

BRIEF DESCRIPTION OF THE DRAWINGS

The disclosure may be understood by reference to the following description taken in conjunction with the accompanying drawings, in which like reference numerals identify like elements, and in which.

In general.

Figure 1:
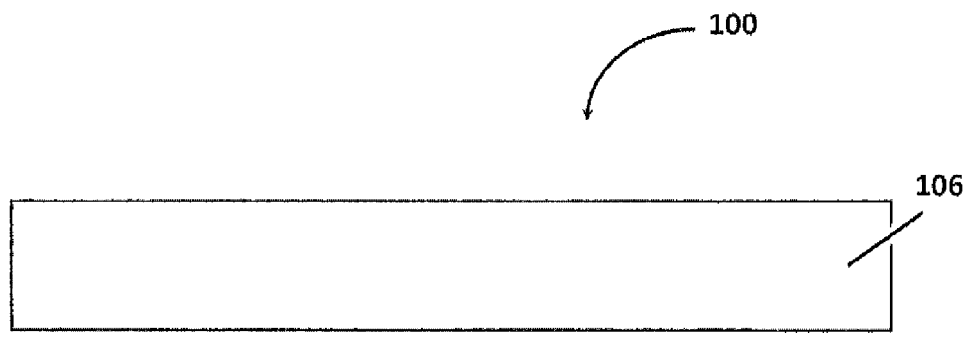
FIGS. 1-54 show cross-sectional views of a structure going through various illustrative examples of fabrication steps of an improved process used in forming integrated circuit device structures, in accordance with embodiments of the present invention.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of controlling the height of various structures used in forming integrated circuit devices or in a semiconducting substrate. As will be readily apparent to those skilled in the art upon a complete reading of the present application, the present method is applicable to a variety of devices, including, but not limited to, ASICs, logic devices, memory devices, etc. Moreover, the present invention may be employed in forming any of a variety of different types of features formed on an integrated circuit product, such as lines, trenches, gate electrode structures, fins for FinFET devices, contact structures, back-end-of-line (BEOL) structures, etc.

Portions of the FinFET device structure are formed using well-known techniques and process steps (e.g., techniques and steps related to doping, photolithography and patterning, etching, material growth, material deposition, surface planarization and the like) that will not be described in detail here. Moreover, the various tasks and process steps described herein may be incorporated into a more comprehensive procedure or process having additional steps or functionality not described in detail herein. In particular, various steps in the manufacture of semiconductor-based transistors are well known and so, in the interest of brevity, many conventional steps will only be mentioned briefly herein or will be omitted entirely without providing the well-known process details.

The techniques and technologies described herein may be utilized to fabricate MOS transistor devices, including NMOS transistor devices, PMOS transistor devices and CMOS transistor devices. In particular, the process steps described herein can be utilized in conjunction with any semiconductor device fabrication process that forms gate structures for transistors. Although the term "MOS device" properly refers to a device having a metal gate electrode and an oxide gate insulator, that term may be used to refer to any semiconductor device that includes a conductive gate electrode (whether metal or other conductive material) that is positioned over a gate insulator (whether oxide or other insulator) which, in turn, is positioned over a semiconductor substrate.

Certain terminology may also be used in the following description for the purpose of reference only, and thus are not intended to be limiting. For example, terms such as "upper," "lower," "above" and "below" refer to directions in the drawings to which reference is made. Terms such as "front," "back," "rear," "side," "outboard" and "inboard" describe the orientation and/or location of portions of a feature or element within a consistent but arbitrary frame of reference which is made clear by reference to the text and the associated drawings describing the item under discussion. Such terminology may include the words specifically mentioned above, derivatives thereof, and words of similar import. Similarly, the terms "first," "second" and other such numerical terms referring to structures do not imply a sequence or order unless clearly indicated by the context. With reference to the attached drawings, various illustrative embodiments of the methods and devices disclosed herein will now be described in more detail.

Figure 54:
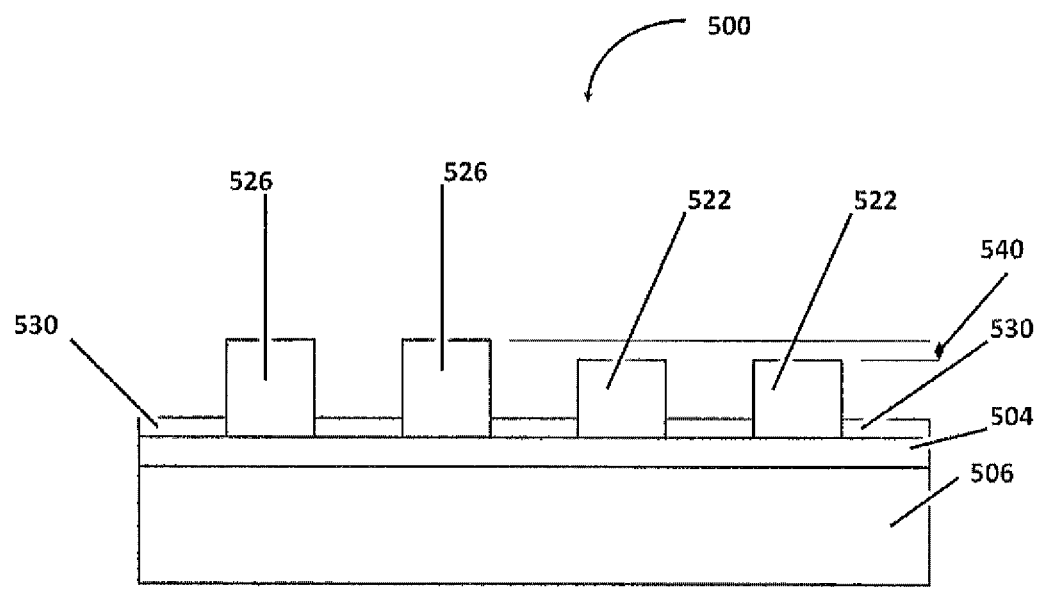

The figures illustrate versions where height is controlled by local isolation recess and where height is controlled by epitaxial growth height. It also depicts the use of a continuous common channel material and isolated common channel material. The present disclosure is directed to various methods of FinFET fabrication, and to FinFET devices. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 1-54, various illustrative embodiments of the methods disclosed herein will now be described in more detail. Additionally, the term "substrate" as used herein is intended to be very broad in nature and cover any type or structure or form of a channel region of a transistor that is commonly in contact with or positioned below a gate insulation layer, such as a layer of silicon/germanium that is commonly found in PMOS devices. The term "substrate" should also be understood to cover any of a variety of different semiconductor materials, such as silicon, silicon/germanium, gallium arsenide, etc. Instead of a silicon substrate, an InP buffer could be used as the substrate.

FIGS. 1-12 show cross-sectional views of a structure 100 going through fabrication steps of an improved FinFET fabrication process, in accordance with embodiments of the present invention. More specifically, FIG. 1, in one embodiment, shows a cross-sectional view of a semiconductor device 100 in an early manufacturing stage. With reference to FIG. 1, the improved FinFET process may start out with providing a semiconductor substrate 106. The substrate 106 may have a variety of configurations, such as the depicted bulk silicon configuration. The substrate may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate may also be made of materials other than silicon. The substrate material 106 is preferably a silicon material as typically used in the semiconductor industry, e.g., relatively pure silicon, as well as silicon admixed with other elements, such as germanium, carbon and the like.

Figure 2:
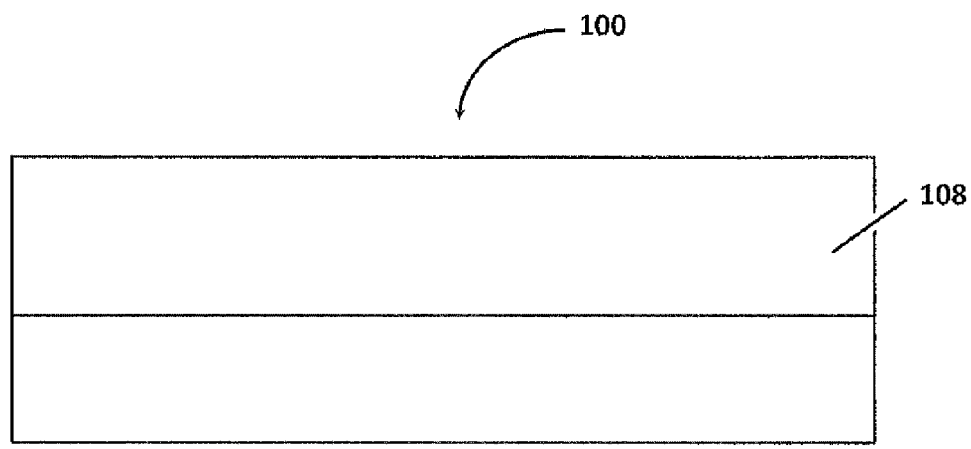

Next, with reference to FIG. 2, a material layer 108 is formed over the top of the substrate 106. In one embodiment, the material layer 108 is an insulator. The material layer 108 may be oxide, such as $SiO_2$, and may be formed by plasma enhanced atomic layer deposition (PEALD), low pressure chemical vapor deposition (LPCVD), chemical vapor deposition (CVD), thermally grown or deposited with other methods.

Figure 3:
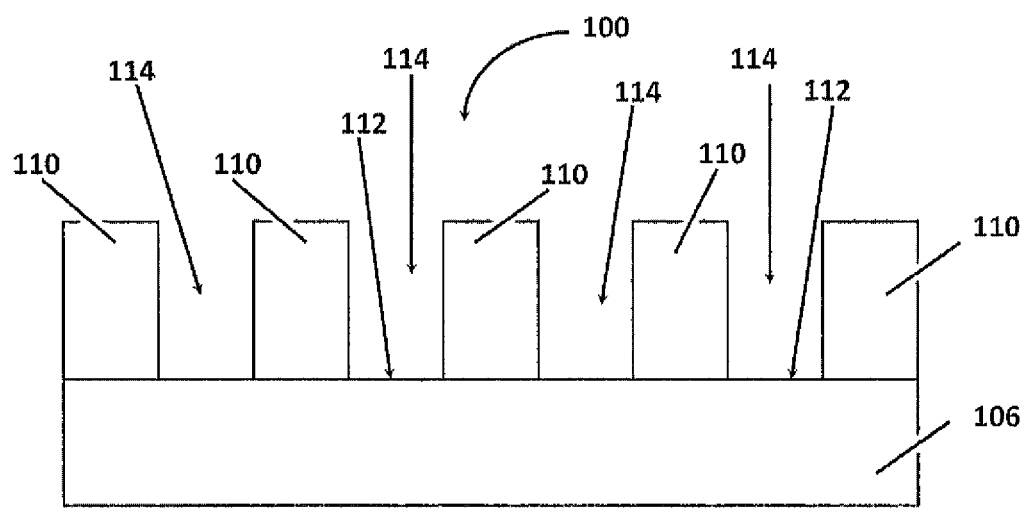

Next, with reference to FIG. 3, patterning of the material layer 108 (FIG. 2) into at least one patterned material structure 110 is performed. The patterning may be performed by etching to define at least one trench 114 and a substrate top surface 112. In one embodiment, the etching may be performed by plasma-based etching, leaving the at least one patterned material structure 110, defining a trench width from 5-25 nm.

Figure 4:
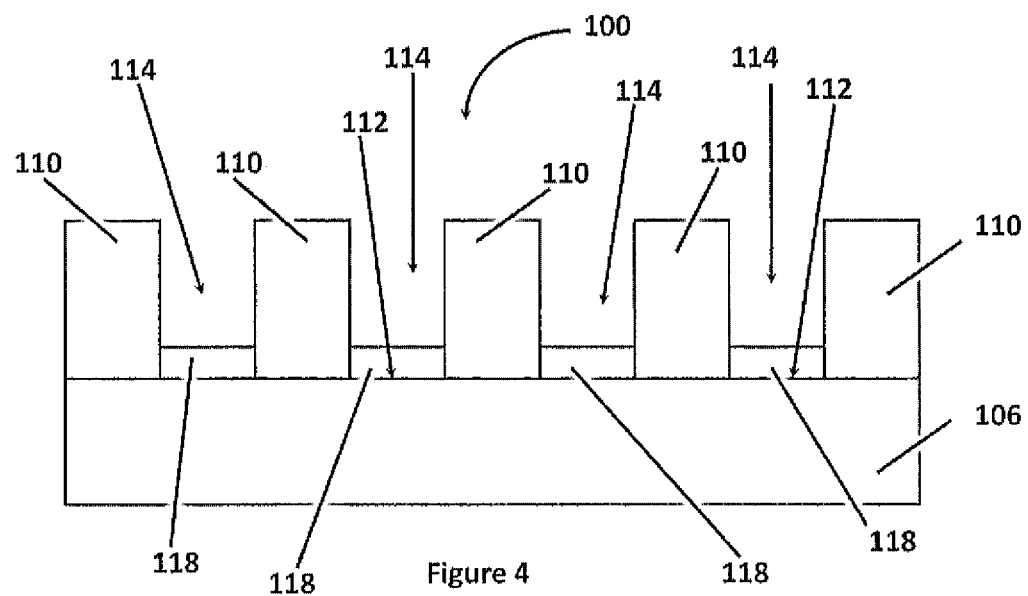

Next, with reference to FIG. 4, a common stack material 118 is formed in the at least one trench 114 over the substrate top surface 112. In one embodiment, the common stack material 118 may be formed by epitaxially growing the common stack material 118. The common stack material 118 may be Si—C, in the case of Si or SiGe channels, or could be InP in the case of group III-V semiconductor material channels. In one embodiment, the common stack material 118 may be 5-20 nm thick.

Figure 5:
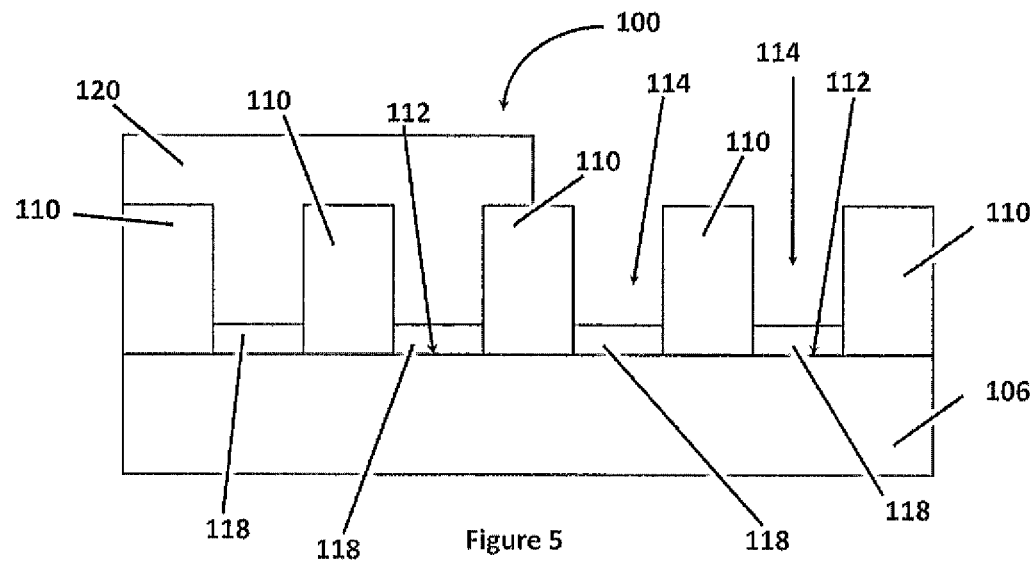

Next, with reference to FIG. 5, a first masking material 120 is formed on a first portion of the common stack material 118 and a first portion of the at least one patterned material structure 110 proximate to the first portion of the common stack 118. In one embodiment, the first masking material 120 may be deposited. The first masking material 120 may be pFET masking material, such as $Si_3N_4$, TiN, $SiO_2$, etc. The first portion of the common stack material 118 and the first portion of the at least one patterned material structure 110 proximate to the first portion of the common stack material may define a cell library.

Figure 6:
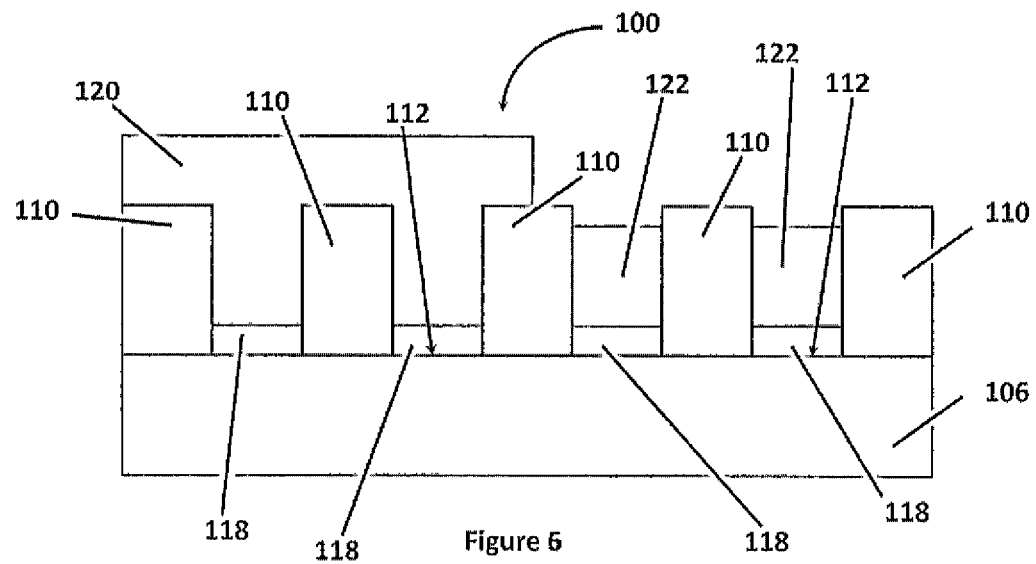

Next, with reference to FIG. 6, a first channel material 122 is formed on a second portion of the common stack material 118. In one embodiment, the first channel material 122 may be formed by epitaxially growing the first channel material 122. The first channel material 122 may be nFET channel material, such as Si, or group III-V semiconductor material. In one embodiment, the first channel material 122 may be 20-100 nm thick.

Figure 7:
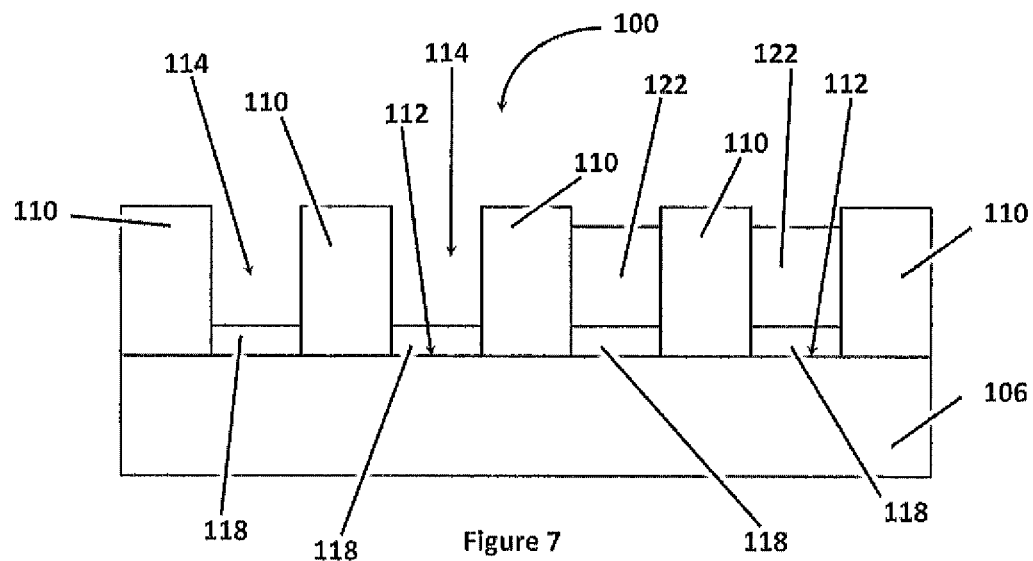

Next, with reference to FIG. 7, removal of the first masking material 120 is performed. In one embodiment, the removal of the first masking material 120 may be performed by plasma-based processing or "wet" chemical methods.

Figure 8:
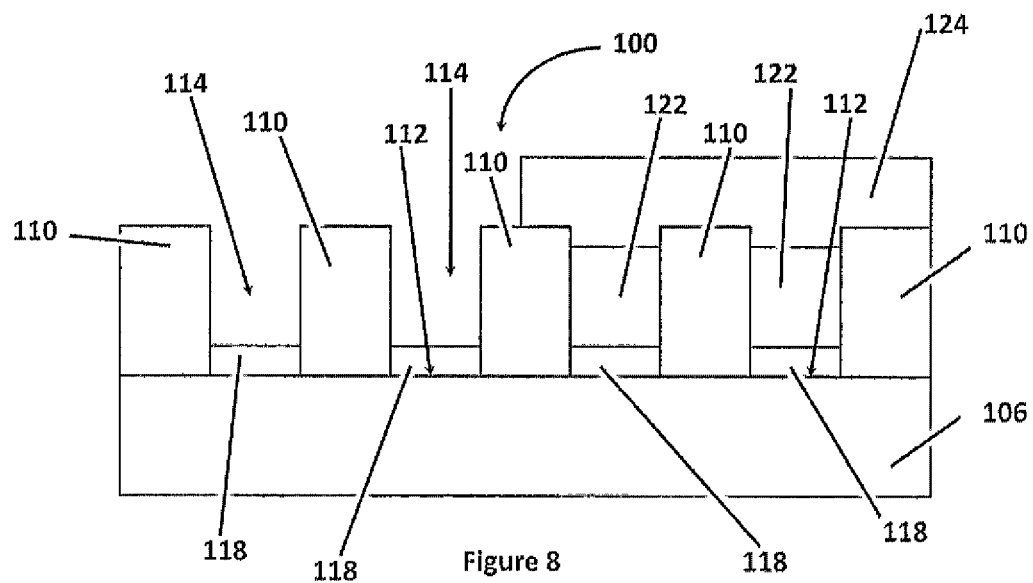

Next, with reference to FIG. 8, a second masking material 124 is formed on the first channel material 122 and a second portion of the at least one patterned material structure 110 proximate to the first channel material 122. In one embodiment, the second masking material 124 may be formed by depositing the second masking material 124. In one embodiment, the second masking material 124 may be nFET masking material, such as $Si_3N_4$, TiN, $SiO_2$, etc. The first channel material 122 and the portion of the at least one patterned material structure 110 proximate to the first channel material 122 may define a cell library.

Figure 9:
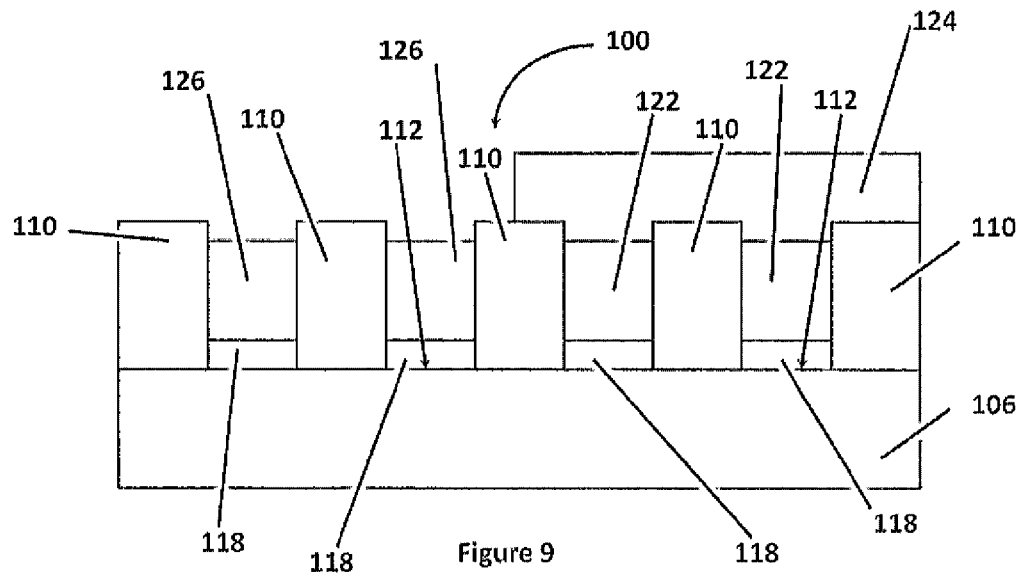

Next, with reference to FIG. 9, a second channel material 126 is formed on the first portion of the common stack material 118. In one embodiment, the second channel material 126 may be epitaxially grown. The second channel material 126 may be pFET channel material and as such may have a germanium (Ge) content, ranging from 25-100% and ranging from 20-100 nm thick.

Figure 10:
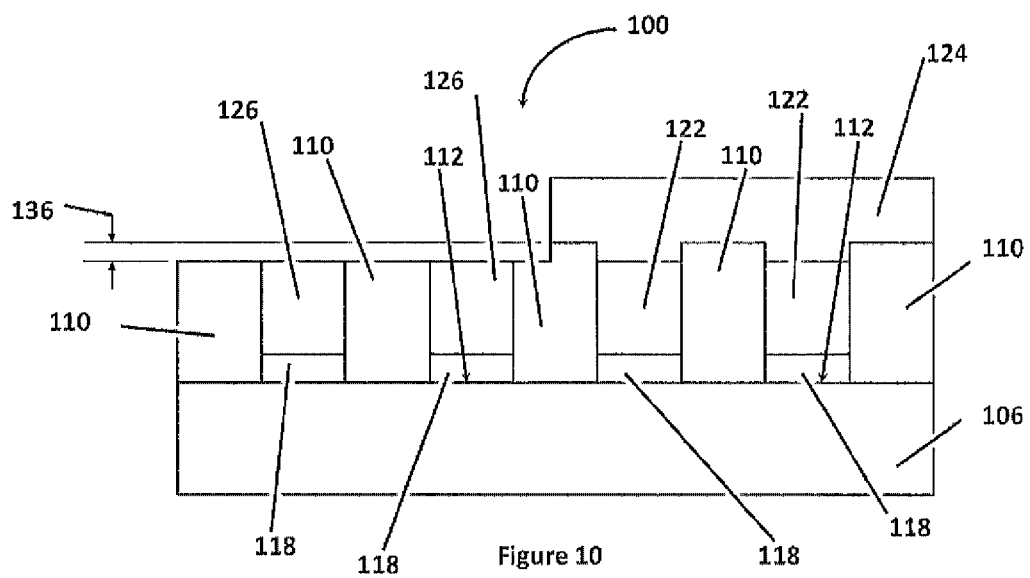

Next, with reference to FIG. 10, a portion of the unmasked material is removed 136, thereby producing an asymmetry between the various structure heights. The material removal may be performed by conventional plasma or wet etching methods.

Next, with reference to FIG. 11, removal of the second masking material 124 is performed. In one embodiment, the removal of the second masking material 124 may be performed by plasma-based processing or "wet" chemical methods.

Next, with reference to FIG. 12, recessing the at least one patterned material structure 110 is performed to produce recessed structure 130, thereby producing an asymmetry between various recessed structure 130 heights 138, 140. In one embodiment, the recessing may be performed by conventional plasma or wet etching methods. In one embodiment, the recessed structure 130 may result from having been recessed to a depth range of 5-40 nm.

Figure 13:
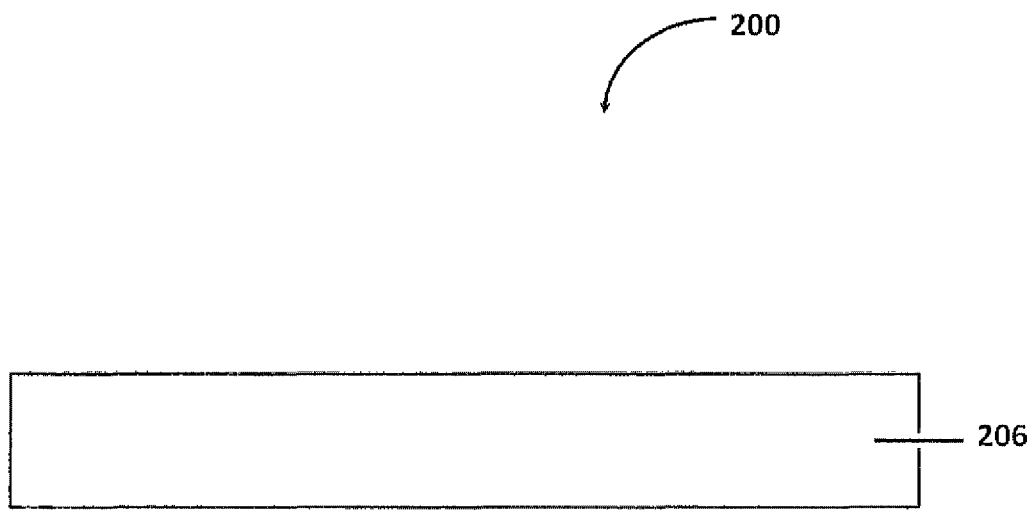

FIGS. 13-24 show cross-sectional views of a structure 200 going through fabrication steps of an improved FinFET fabrication process, in accordance with embodiments of the present invention. More specifically, FIG. 13, in one embodiment, shows a cross-sectional view of a semiconductor device 200 in an early manufacturing stage. With reference to FIG. 13, the improved FinFET process may start out with providing a semiconductor substrate 206.

Figure 14:
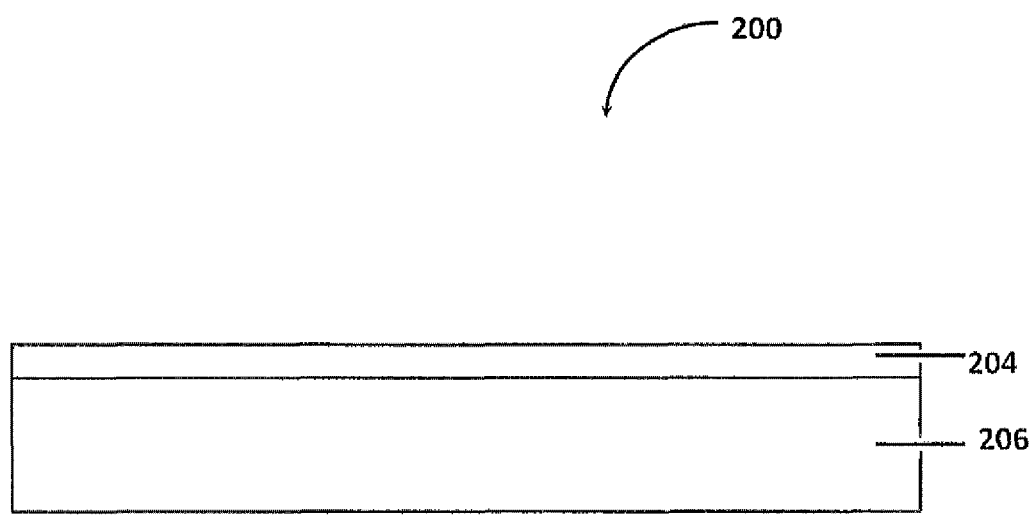

Next, with reference to FIG. 14, a common stack layer 204 is formed over the substrate 206. In one embodiment, the common stack layer 204 may be SiC in the case of Si or SiGe channels, or could be InP in the case of group III-V material channels, and may be formed by epitaxial growth or other deposition methods. In one embodiment, the common stack layer 204 may be 5-20 nm thick.

Figure 15:
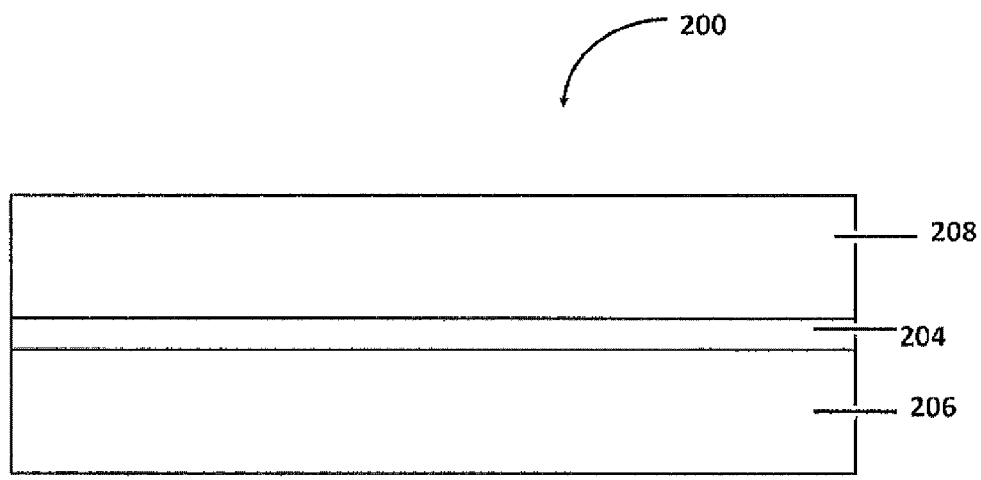

Next, with reference to FIG. 15, a material layer 208 is formed over the common stack layer 204. In one embodiment, the material layer 208 may be silicon oxide or silicon nitride and may be formed by various depositing or growth methods.

Figure 16:
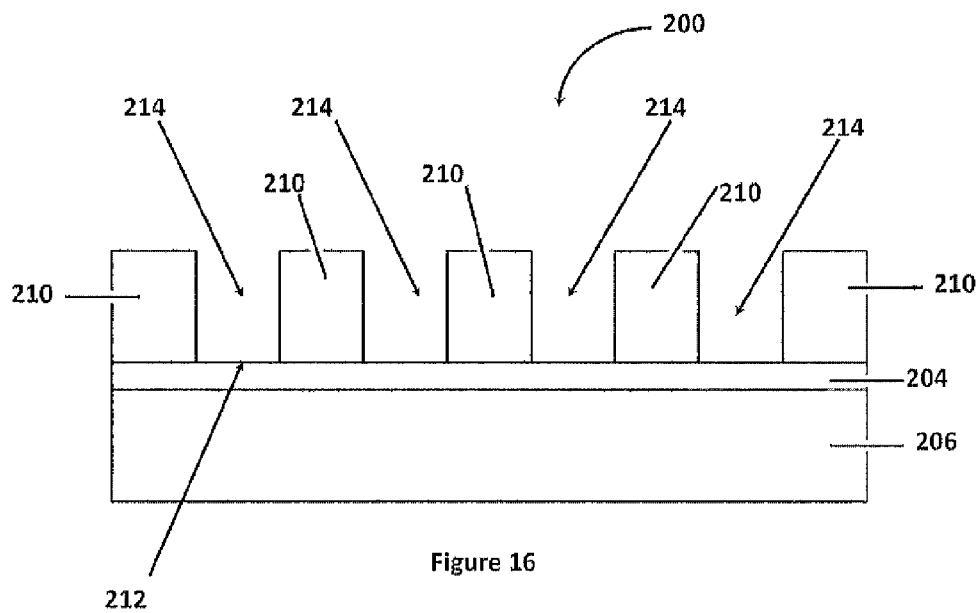

Next, with reference to FIG. 16, patterning of the material layer 208 is performed to produce at least one patterned material structure 210. The patterning may be performed by etching material layer 208 to define at least one trench 214 and a channel layer top surface 212. In one embodiment, the etching may be performed by plasma-based processing, leaving the at least one patterned material 210.

Figure 17:
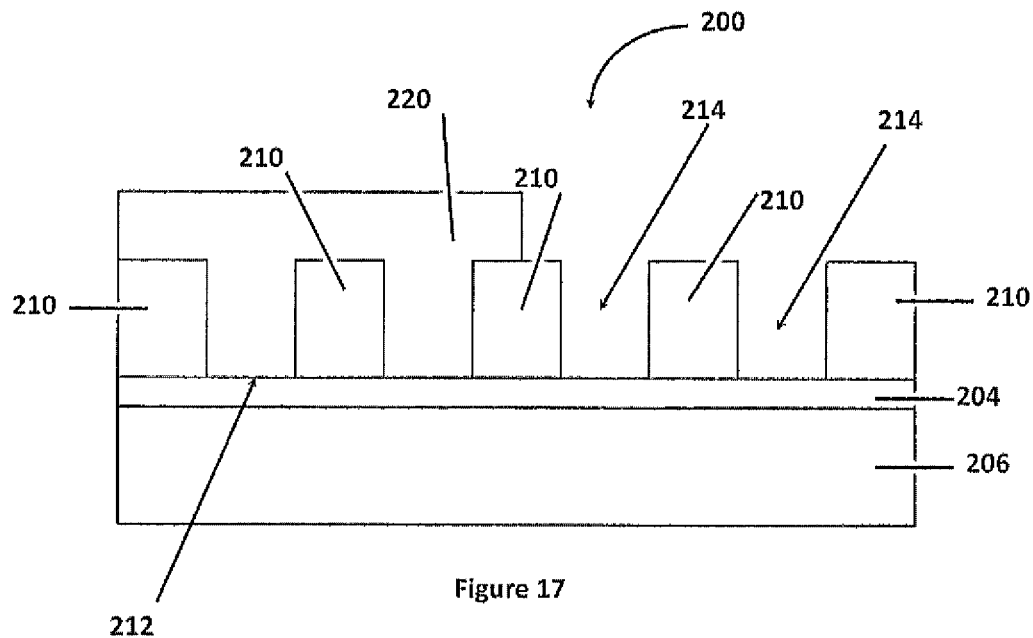

Next, with reference to FIG. 17, a first masking material 220 is formed on a first portion of the channel layer 204 and a first portion of the at least one patterned material structure 210. In one embodiment, forming the first masking material 220 may be by depositing and patterning the first masking material 220. The first masking material 220 may be pFET masking material, such as Si$_3$N$_4$, TiN, SiO$_2$, etc.

Figure 18:
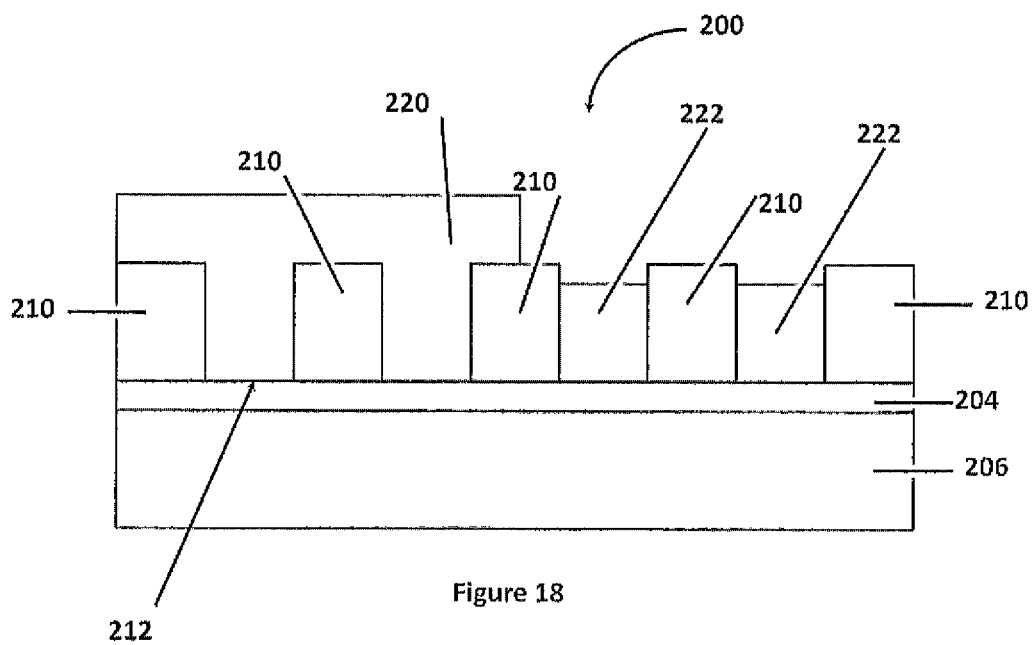

Next, with reference to FIG. 18, a first channel material 222 is formed on a second portion of the common stack layer 204. In one embodiment the first channel material 222 may be formed by epitaxially growing the first channel material 222. The first channel material 222 may be nFET channel material, such as Si, or group III-V semiconductor material. In one embodiment, the first channel material 222 may be 20-100 nm thick.

Figure 19:
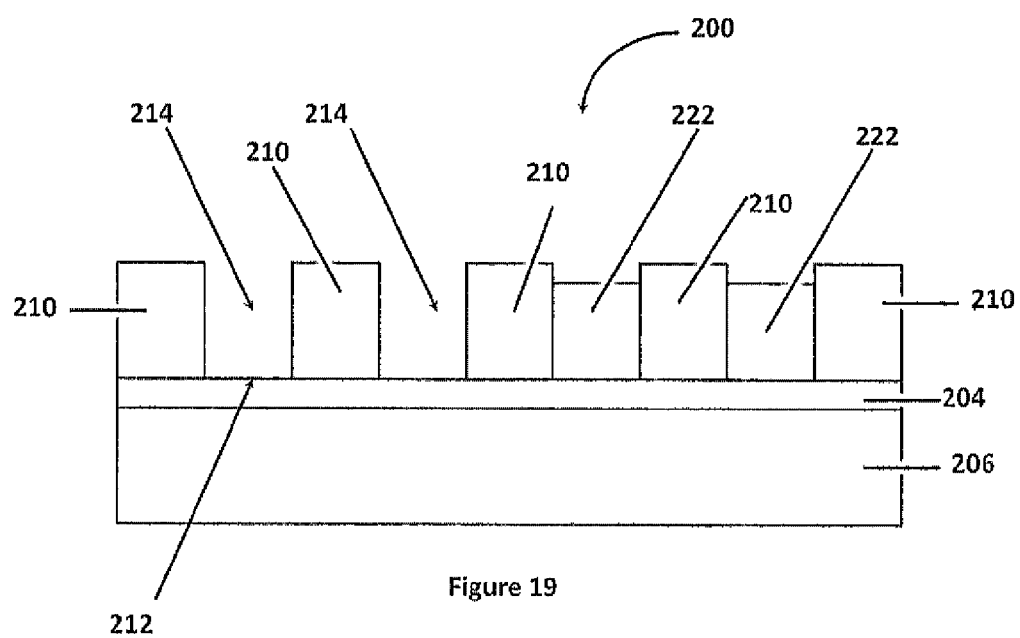

Next, with reference to FIG. 19, removal of the first masking material 220 is performed. In one embodiment, removal of the first masking material 220 may be performed by "wet" chemical removal.

Figure 20:
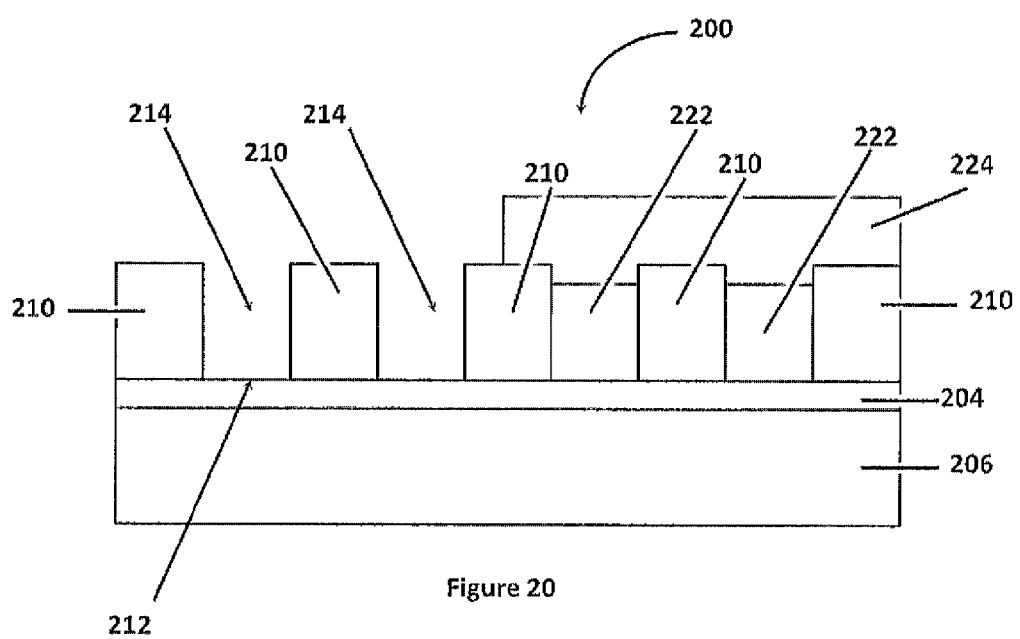

Next, with reference to FIG. 20, a second masking material 224 is formed on the first channel material 222 and a second portion of the at least one patterned material structure 210 proximate to the first channel material 222. In one embodiment, the second masking material 224 is formed by depositing the second masking material 224. In one embodiment, the second masking material 224 may be nFET masking material such as Si$_3$N$_4$, TiN, SiO$_2$, etc.

Figure 21:
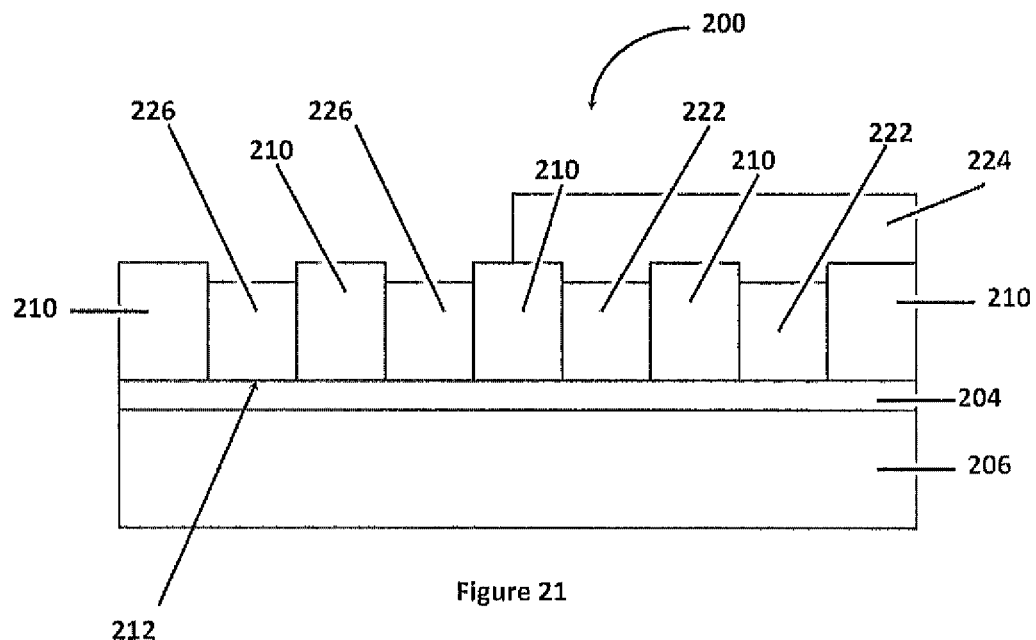

Next, with reference to FIG. 21, a second channel material 226 is formed on the first portion of the common stack layer 204. In one embodiment, the second channel material 226 may be epitaxially grown. The second channel material 226 may be pFET channel material and as such have a Ge content ranging from 25-100%. In one embodiment, the second channel material 226 may be 15-35 nm thick.

Figure 22:
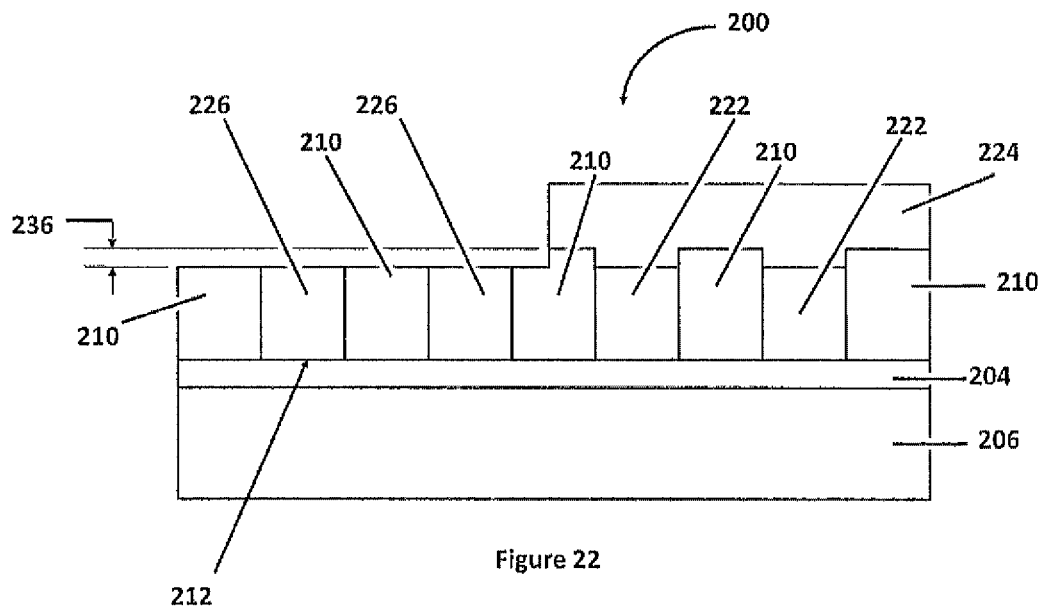

Next, with reference to FIG. 22, a portion of the unmasked material is removed, thereby producing an asymmetry between the various structure heights 236. The material removal may be performed by conventional plasma or wet etching methods.

Figure 23:
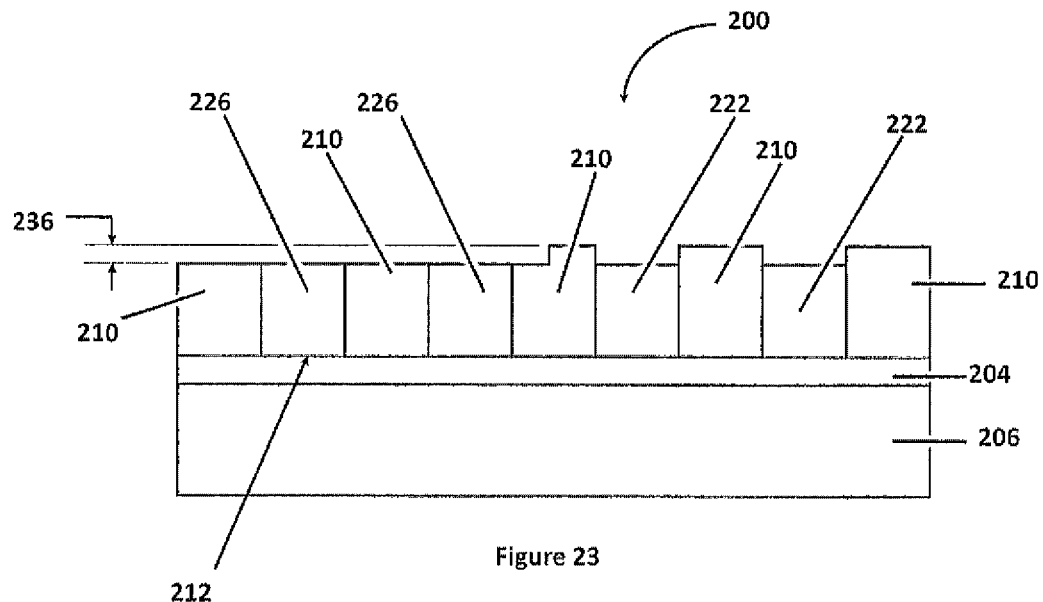

Next, with reference to FIG. 23, removal of the second masking material 224 is performed. In one embodiment, the removal of the second masking material 224 may be performed by "wet" chemical removal.

Figure 24:
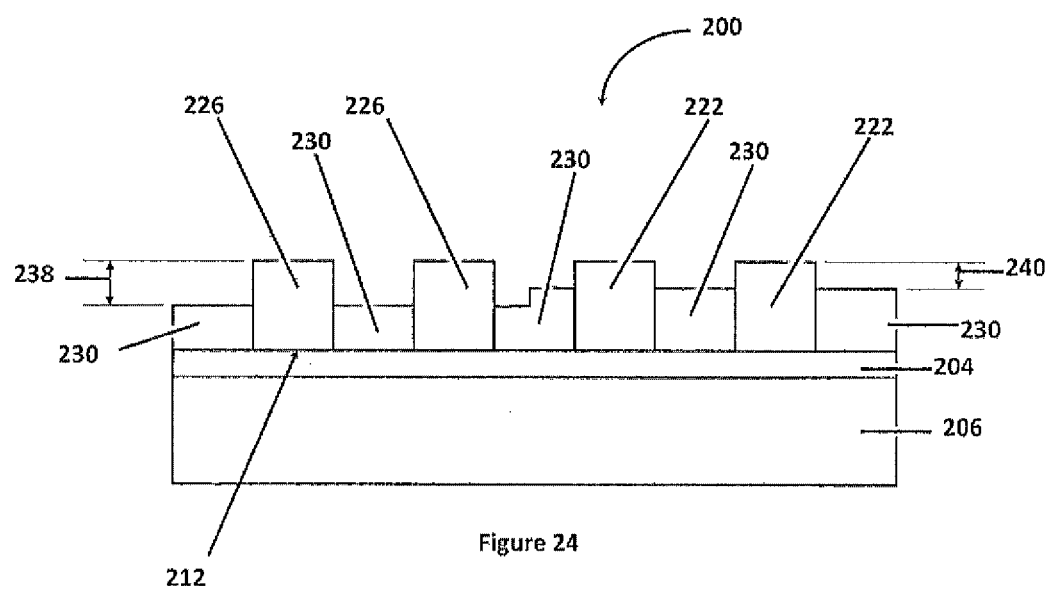

Next, with reference to FIG. 24, recessing of the at least one patterned material structure 210 is performed to produce recessed structure 230, thereby producing an asymmetry between various recessed structure 230 heights 238, 240. In one embodiment, the recessing may be performed by conventional plasma or wet etching methods. In one embodiment, the recessed structure may be produced by recessing the patterned material 210 to a depth range of 5-40 nm.

Figure 25:
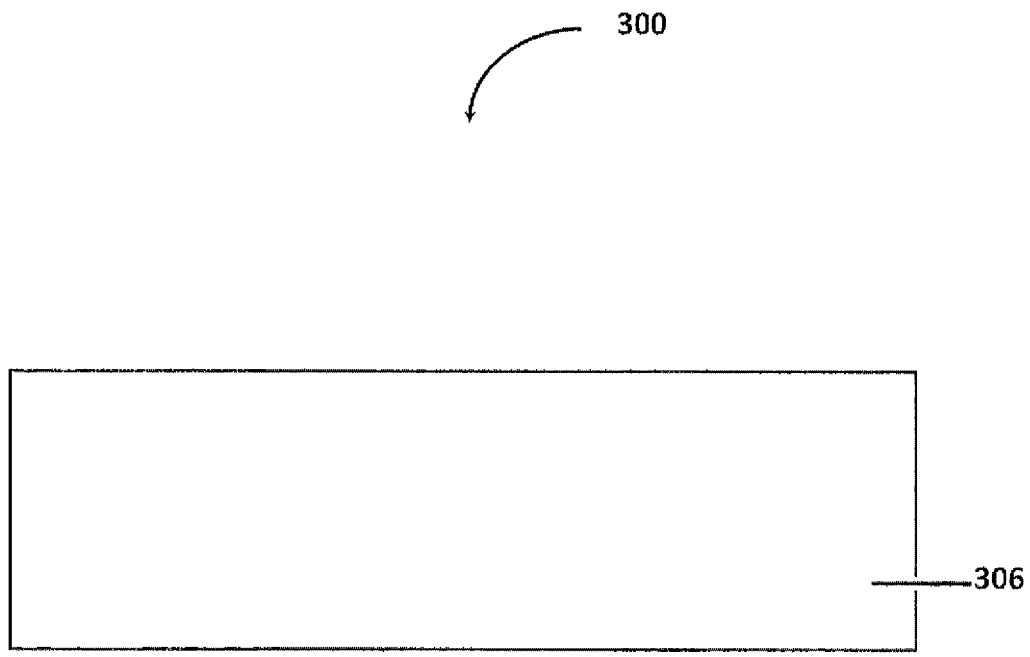

FIGS. 25-32 show cross-sectional views of a structure 300 going through fabrication steps of an improved FinFET fabrication process, in accordance with embodiments of the present invention. More specifically, FIG. 25, in one embodiment, shows a cross-sectional view of a semiconductor device 300 in an early manufacturing stage. With reference to FIG. 25, the improved FinFET process may start out with providing a semiconductor substrate 306.

Figure 26:
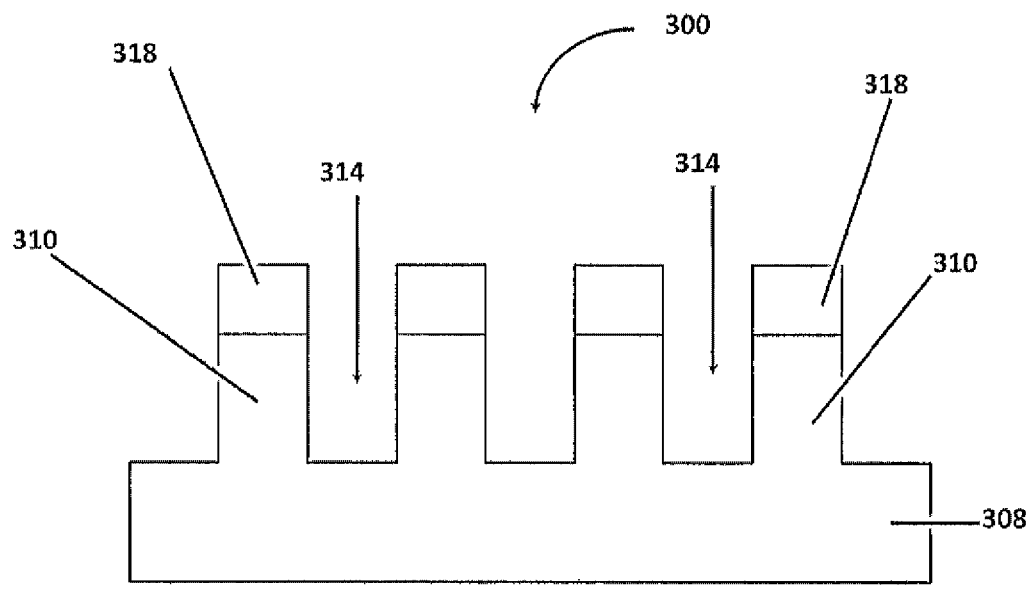

Next, with reference to FIG. 26, one or more fins 310 are formed in the substrate 306. The fins 310 may be formed by patterning and etching the substrate 306. A first masking material 318 is formed and patterned on the substrate 306 and remains on the fins 310 after fin formation. At least one trench 314 is defined when forming the fins 310. In one embodiment, the first masking material 318 may be Si$_3$N$_4$, SiO2 or any dielectric with good etch contrast to the channel material (Si, SiGe, III-V, etc.).

Figure 27:
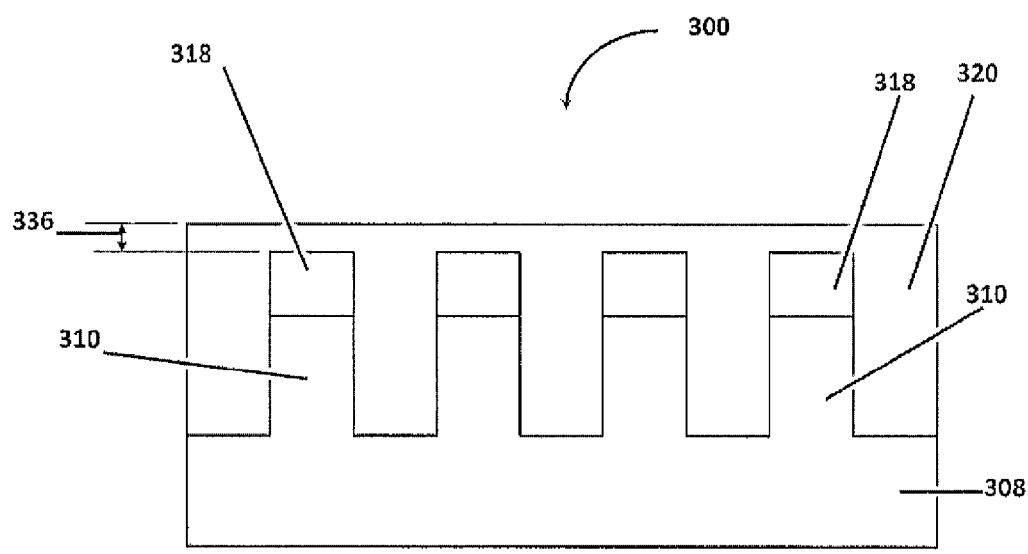

Next, with reference to FIG. 27, a material layer 320 is formed in the at least one trench 314. The material layer 320 may be formed above 336 the first masking material 318 and in one embodiment to a height of 0 (bottom up fill) to 50 nm. In one embodiment, the material layer 320 may be formed by ALD, CVD, spin-on, etc. and may be an insulator, with SiO$_2$ preferred.

Figure 28:
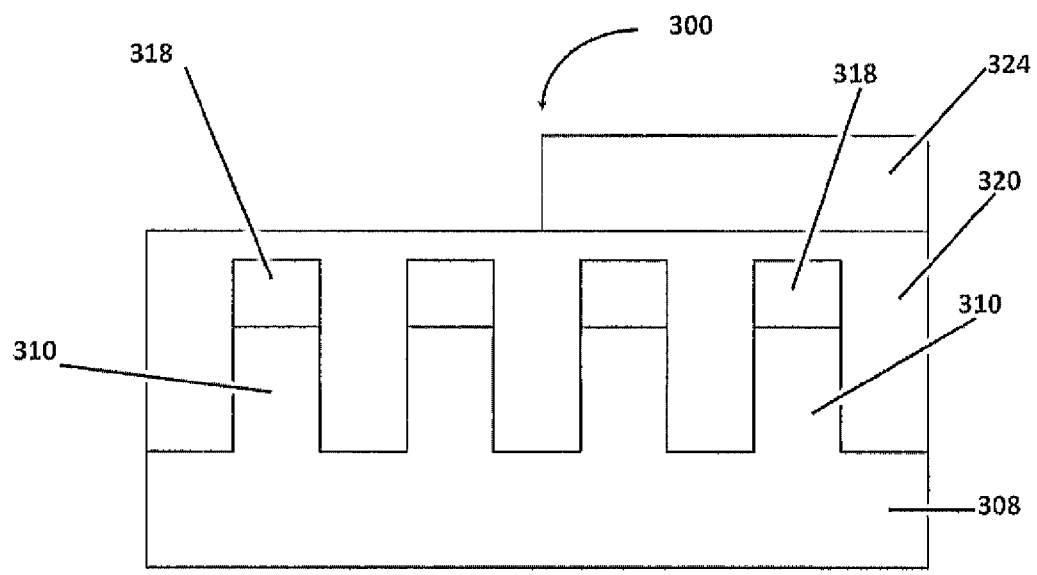

Next, with reference to FIG. 28, a second masking material 324 is formed on a first portion of the material layer 320. In one embodiment, the second masking material 324 may be formed by depositing and patterning the second mask material 324. The second masking material 324 may be TiN, SiN, photoresist, organic planarizing layer (OPL), aC, or SiO$_2$.

Figure 29:
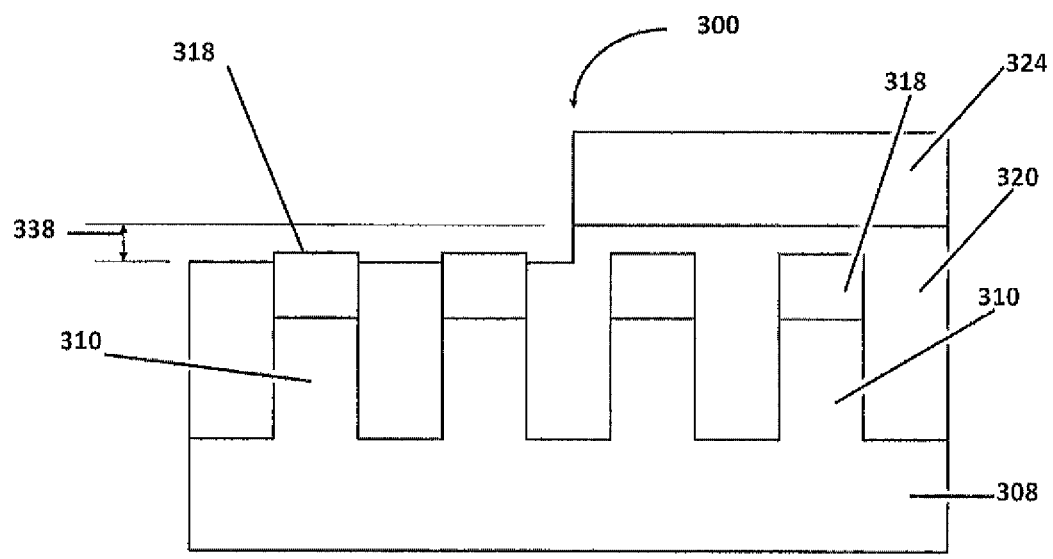

Next, with reference to FIG. 29, a portion of the material layer 320 that is not covered by the second masking material 324 is removed, thereby producing an asymmetry across the height 338 of the material layer 320. The material removal may be performed by conventional plasma or wet etching methods.

Figure 30:
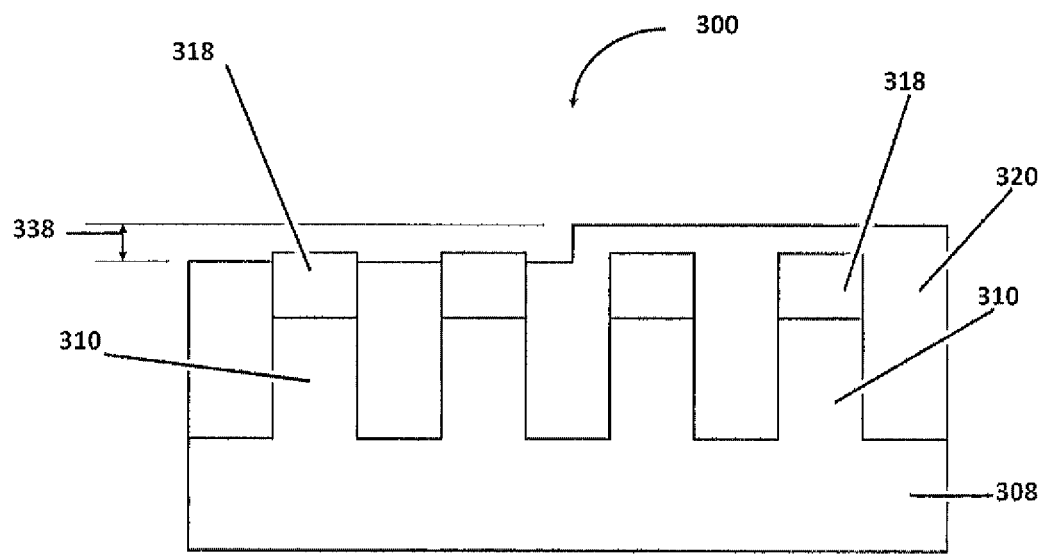

Next, with reference to FIG. 30, removal of the second masking material 324 is performed. In one embodiment, the removal of the second masking material 324 may be performed by conventional plasma or wet etching.

Figure 31:
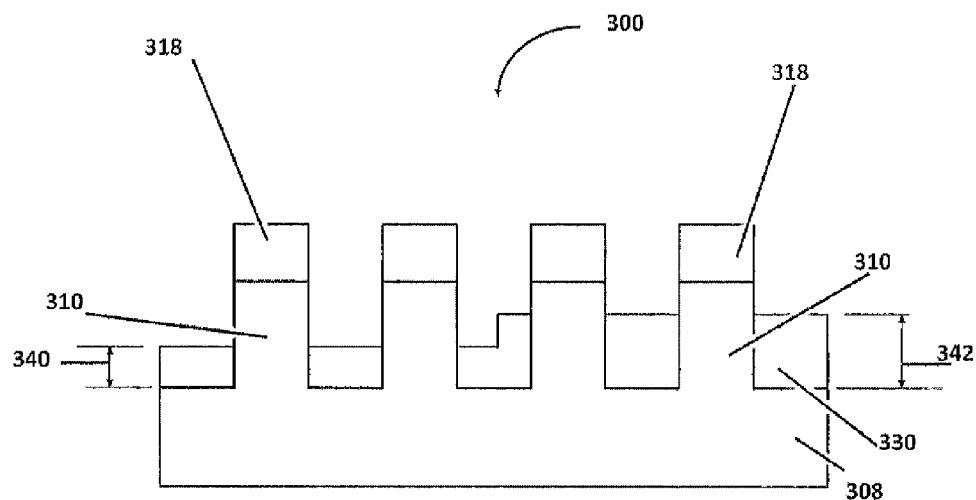

Next, with reference to FIG. 31, recessing the material layer 320 is performed to produce recessed structure 330, thereby producing an asymmetry between various recessed structure 330 heights 340, 342. In one embodiment, the recessing may be performed by conventional plasma or wet etching methods. In one embodiment, the recessed structure height may be the result of recessing by 10-50 nm.

Figure 32:
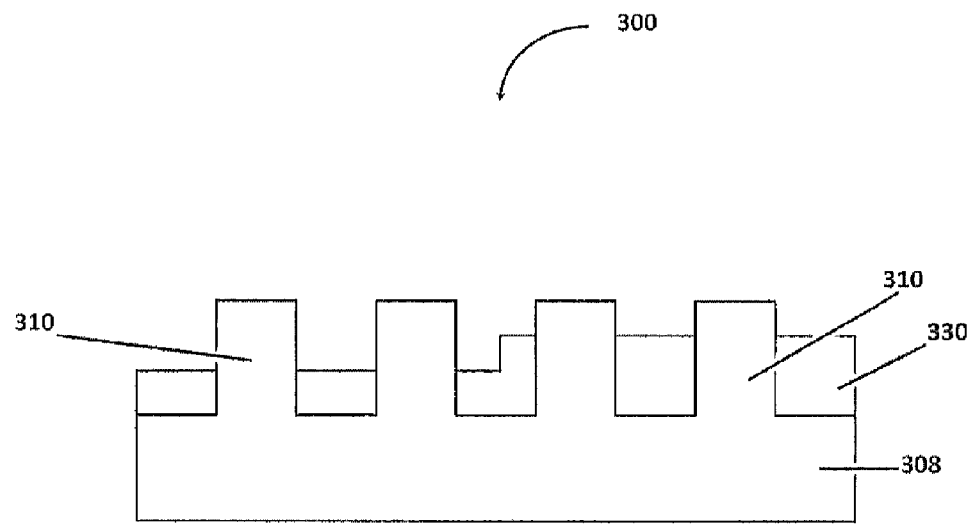

Next, with reference to FIG. 32, removal of the first masking material 318 is performed. In one embodiment, the removal of the first masking material 318 may be performed by conventional plasma or wet etching methods.

Figure 33:
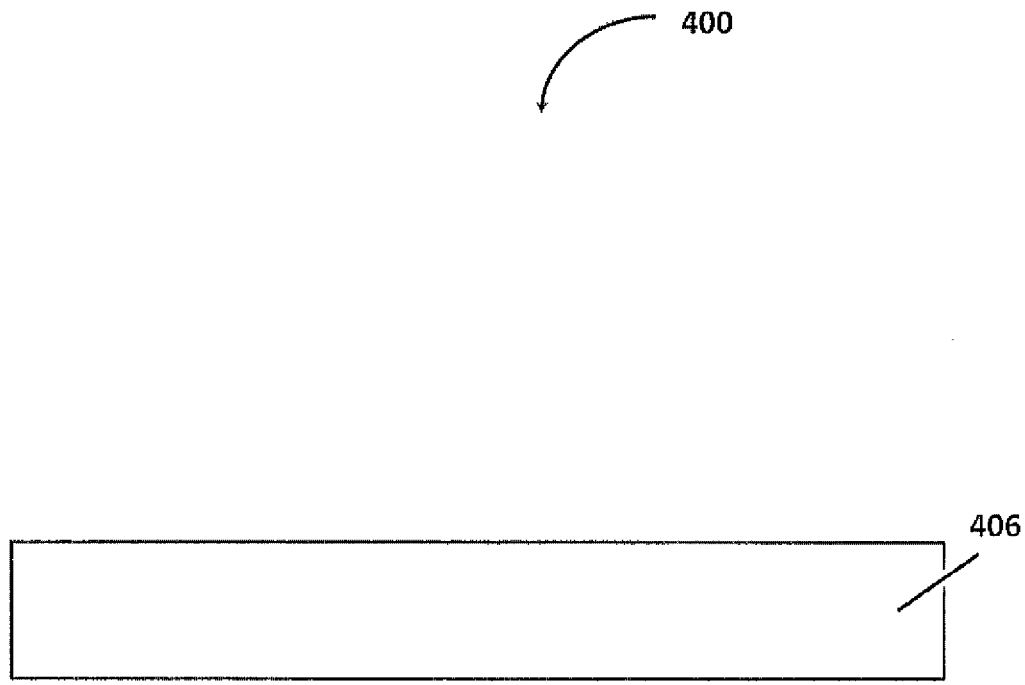

FIGS. 33-43 show cross-sectional views of a structure 400 going through fabrication steps of an improved FinFET fabrication process, in accordance with embodiments of the present invention. More specifically, FIG. 33, in one embodiment, shows a cross-sectional view of a semiconductor device 400 in an early manufacturing stage. With reference to FIG. 33, the improved FinFET process may start out with providing a semiconductor substrate 406.

Figure 34:
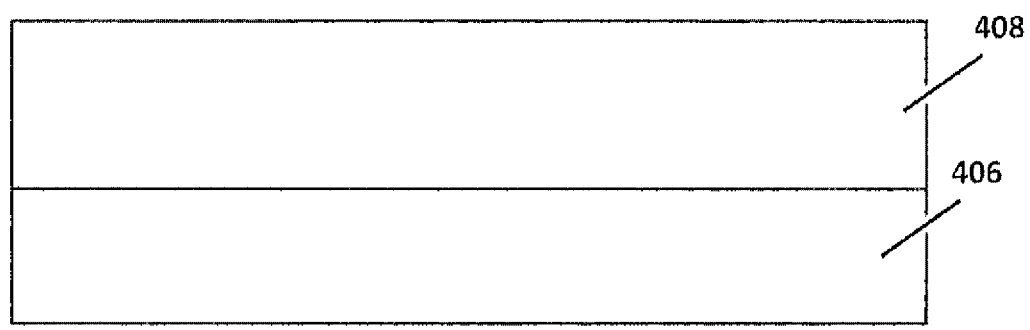

Next, with reference to FIG. 34, a material layer 408 is formed over the substrate 406. In one embodiment, the material layer 408 may be insulator, such as an oxide, SiO$_2$, and may be formed by deposition or thermal oxidation methods.

Figure 35:
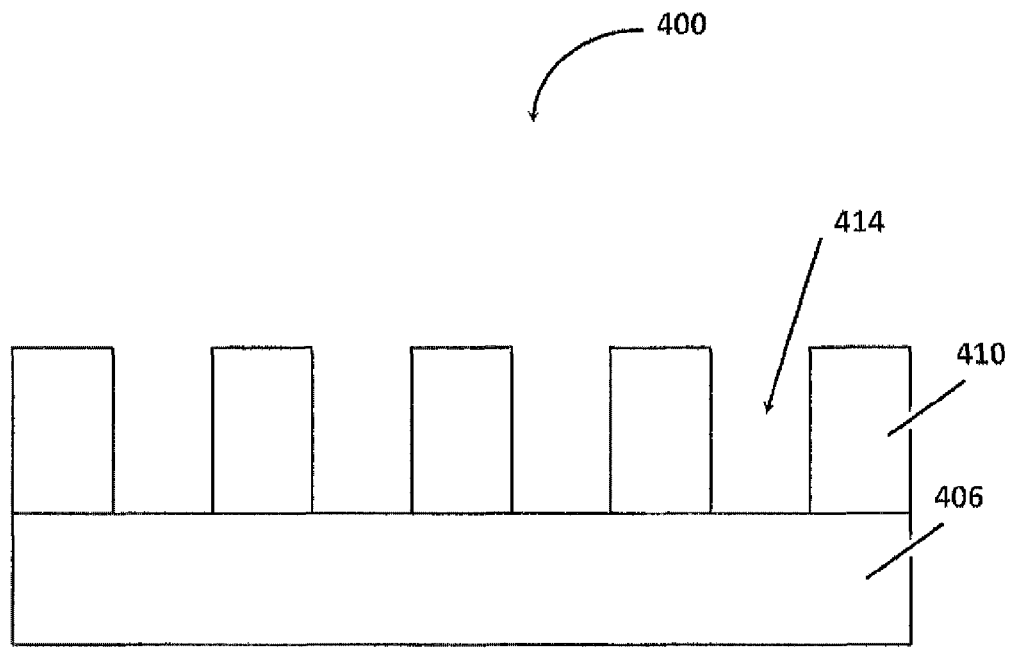

Next, with reference to FIG. 35, patterning the material layer 408 into at least one patterned material structure 410 is performed. Patterning the material layer 408 may be performed by etching material layer 408 to define at least one trench 414. In one embodiment, the etching may be performed by plasma-based processing, leaving the at least one patterned material structure 410.

Figure 36:
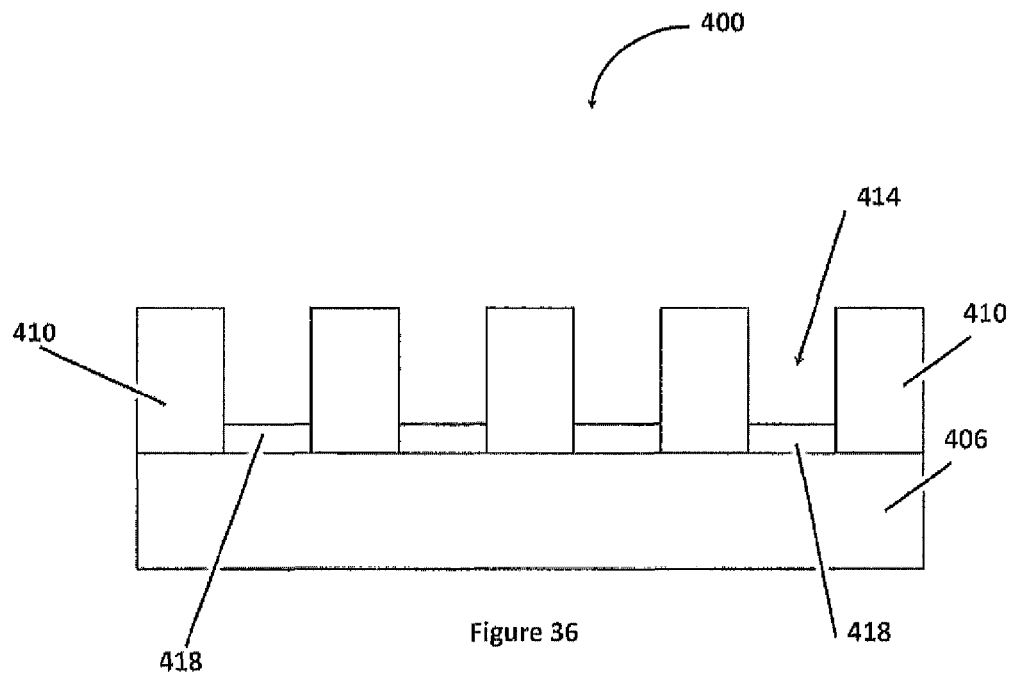

Next, with reference to FIG. 36, a common stack material 418 is formed in the at least one trench 414. In one embodiment, the common stack material 418 may be SiC, uniquely doped Si, etc., and may be formed by deposition techniques or epitaxially grown. In one embodiment, the common stack material 418 may be 5-20 nm thick.

Figure 37:
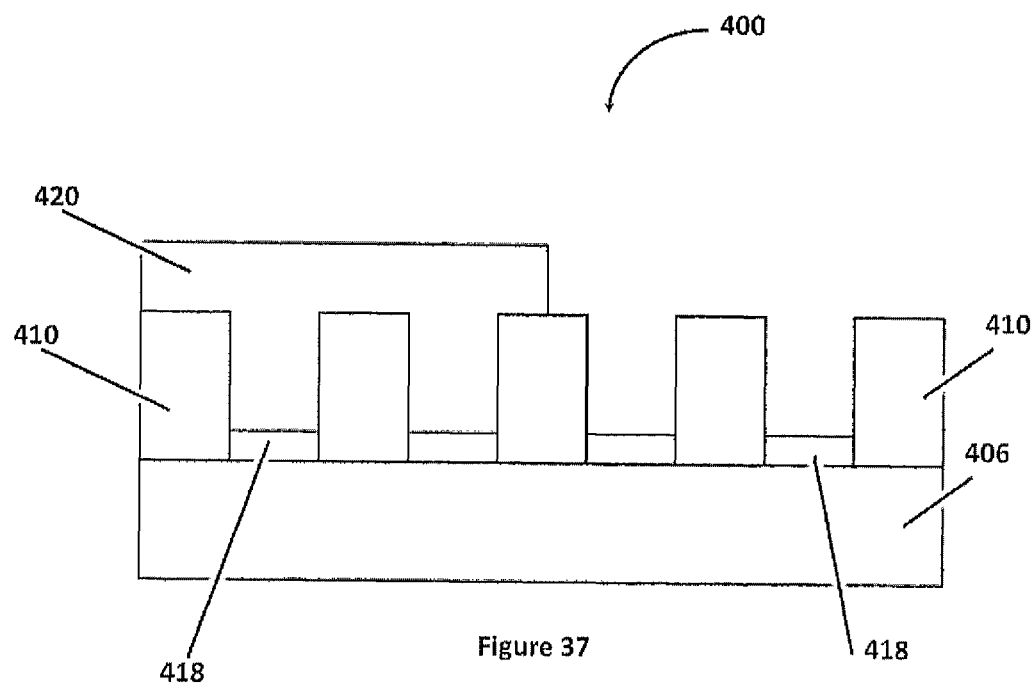

Next, with reference to FIG. 37, a first masking material 420 is formed on a first portion of the channel material 418 and a first portion of the at least one patterned material structure 410. In one embodiment, forming the first masking material 420 may include depositing and patterning the first masking material 420. The first masking material 420 can be a pFET masking material, such as Si$_3$N$_4$, TiN, SiO$_2$, etc.

Figure 38:
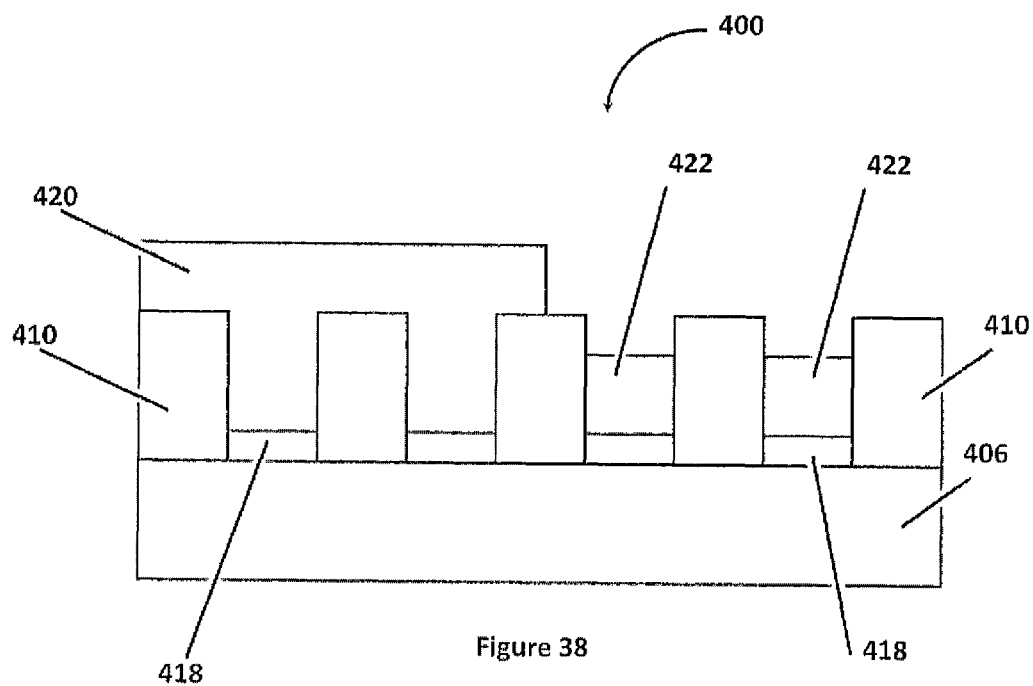

Next, with reference to FIG. 38, a first channel material 422 is formed on a second portion of the common stack material 418. In one embodiment, the first channel material 422 may be formed by epitaxially growing the first channel material 422. The first channel material 422 may be an nFET channel material, such as Si, uniquely doped Si, etc. In one embodiment, the first channel material 422 may be 40-60 nm thick.

Figure 39:
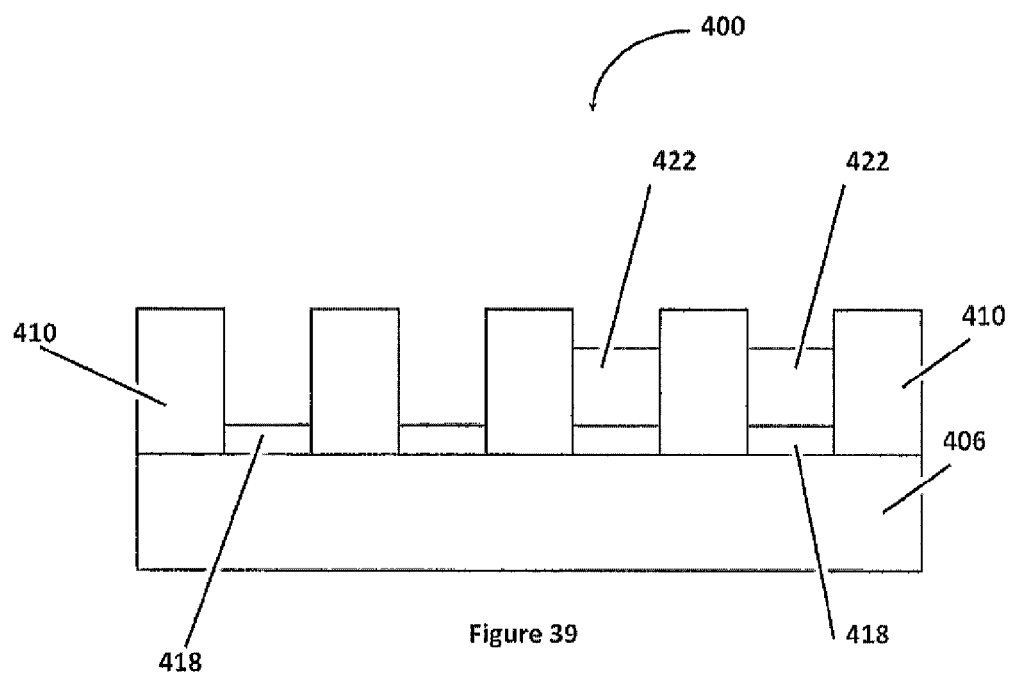

Next, with reference to FIG. 39, removal of the first masking material 420 is performed. In one embodiment, the removal may be performed by "wet" chemical removal methods.

Figure 40:
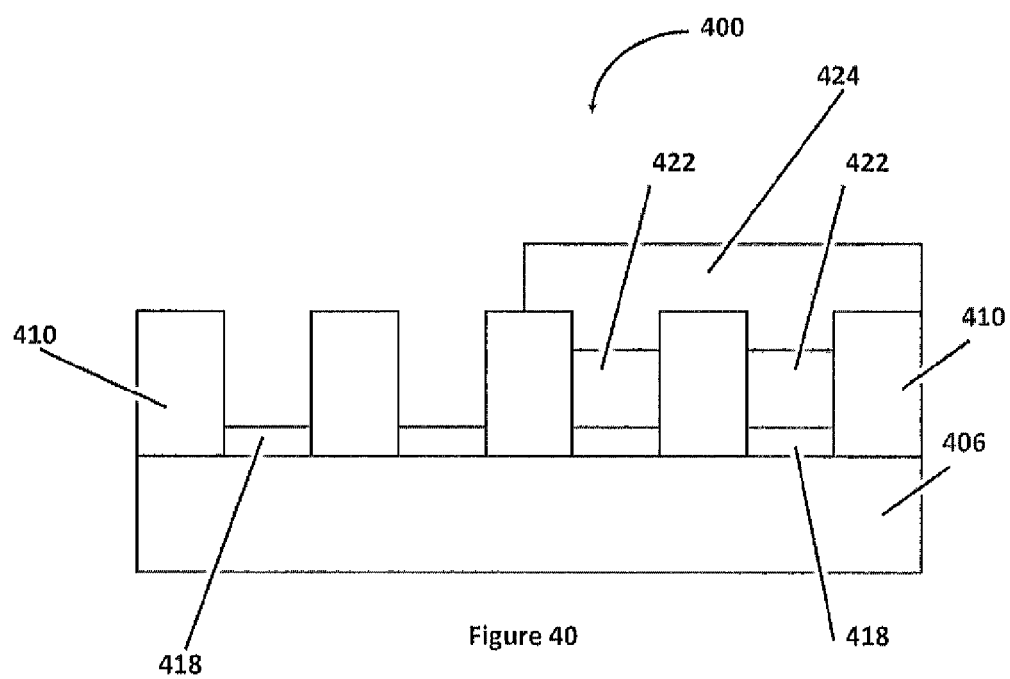

Next, with reference to FIG. 40, a second masking material 424 is formed on the first channel material 422 and a second portion of the at least one patterned material structure 410 proximate to the first channel material 422. In one embodiment, forming the second masking material 424 may be performed by depositing and patterning the second masking material 424. In one embodiment, the second masking material 424 may be nFET masking material such as Si$_3$N$_4$, TiN, SiO$_2$, etc.

Figure 41:
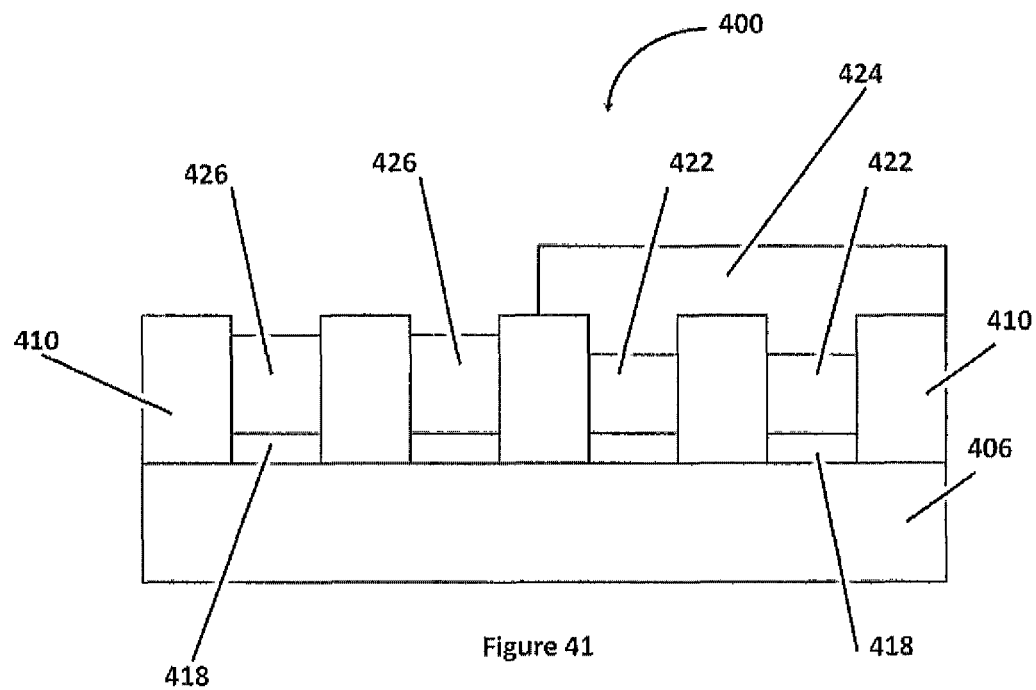

Next, with reference to FIG. 41, a second channel material 426 is formed on the first portion of the common stack material 418 and the second channel material 426 is formed to a height different than the height of the first channel material 422. In one embodiment, the second channel material 426 may be epitaxially grown. The second channel material 426 may be a pFET channel material and have a Ge content ranging from 25-100%. In one embodiment, the second channel material 426 may be 40-60 nm thick.

Figure 42:
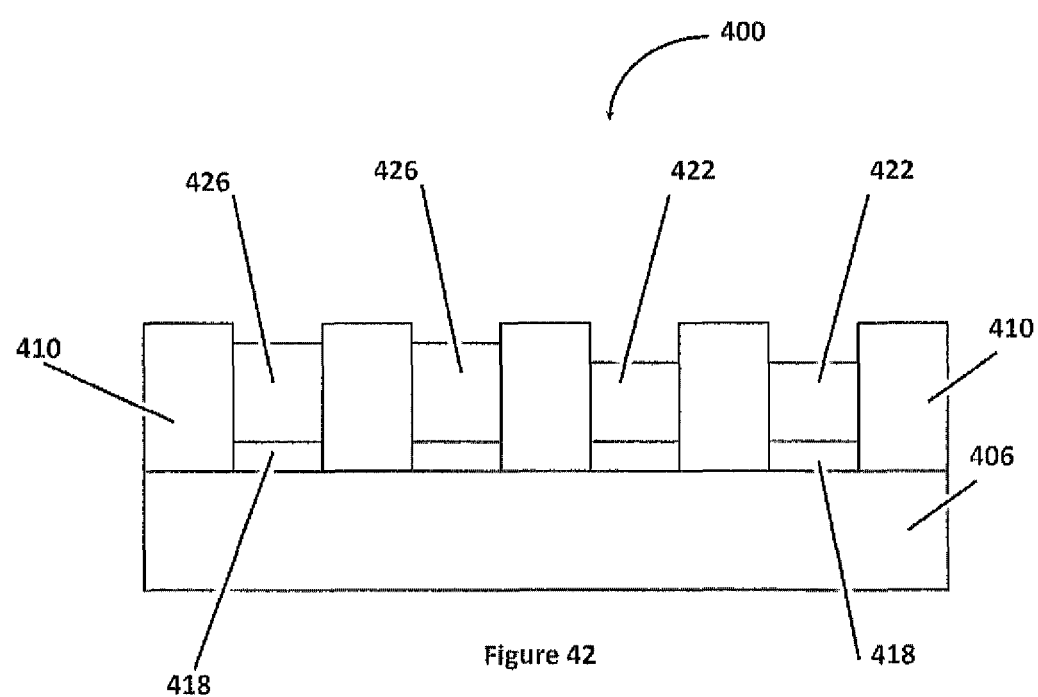

Next, with reference to FIG. 42, removal of the second masking material 424 is performed. In one embodiment, the removal of the second masking material 424 may be performed by "wet" chemical etching methods.

Figure 43:
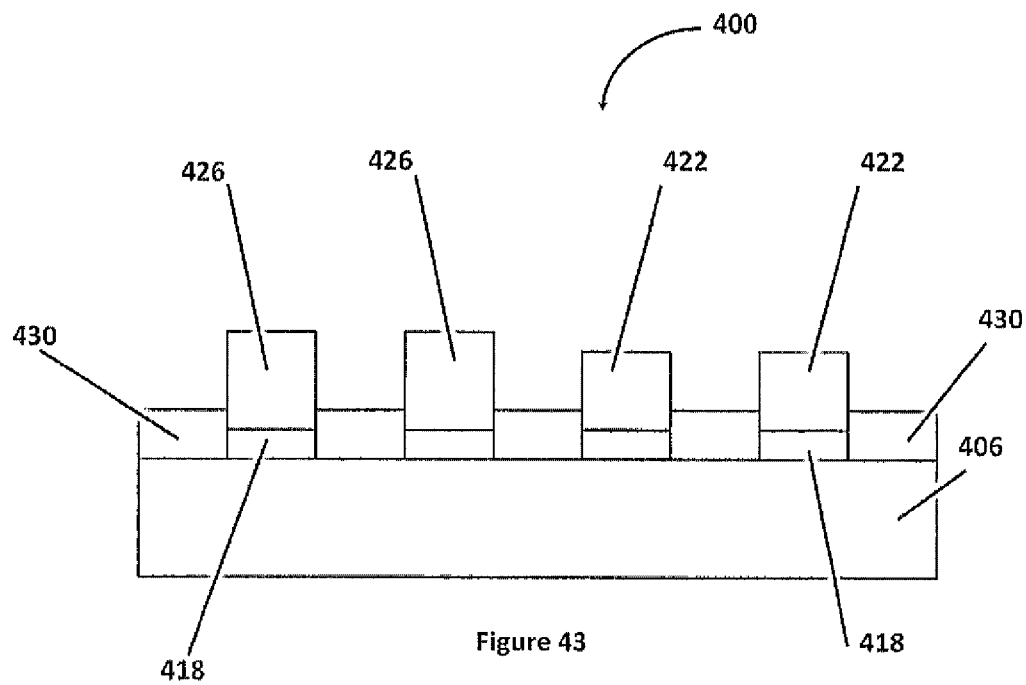

Next, with reference to FIG. 43, recessing of the at least one patterned material structure 410 is performed to produce recessed structure 430. In one embodiment, the recessing may be performed by plasma-based processing, sublimation-based methods or "wet" chemical etching methods. In one embodiment, the recessed structure 430 may be produced by recessing the at least one patterned material structure 410 to a depth range of 25-40 nm.

Figure 44:
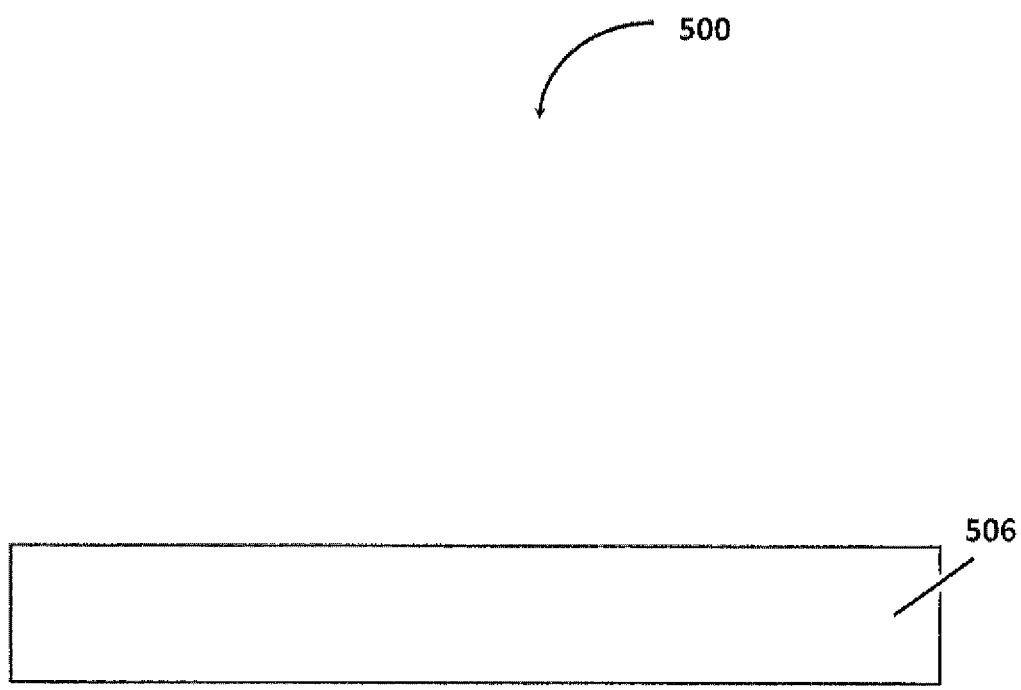

FIGS. 44-54 show cross-sectional views of a structure 500 going through fabrication steps of an improved FinFET fabrication process, in accordance with embodiments of the present invention. More specifically, FIG. 44, in one embodiment, shows a cross-sectional view of a semiconductor device 500 in an early manufacturing stage. With reference to FIG. 44, the improved FinFET process may start out with providing a semiconductor substrate 506.

Figure 45:
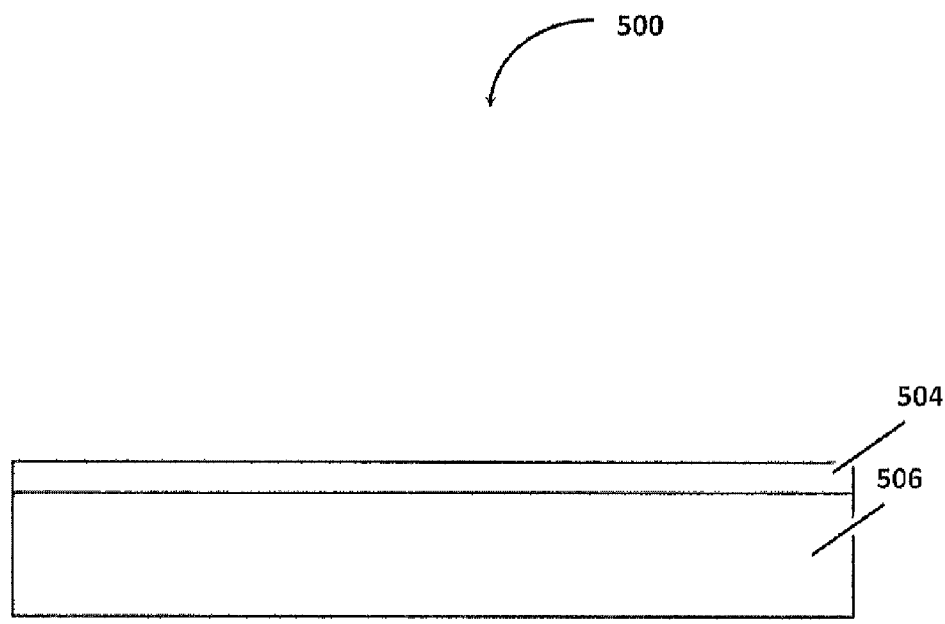

Next, with reference to FIG. 45, a common stack layer 504 is formed over the substrate 506. In one embodiment, the common stack layer 504 may be SiC, uniquely doped Si, etc., and may be formed by deposition techniques or epitaxially grown. In one embodiment, the common stack layer 504 may be 5-20 nm thick.

Figure 46:
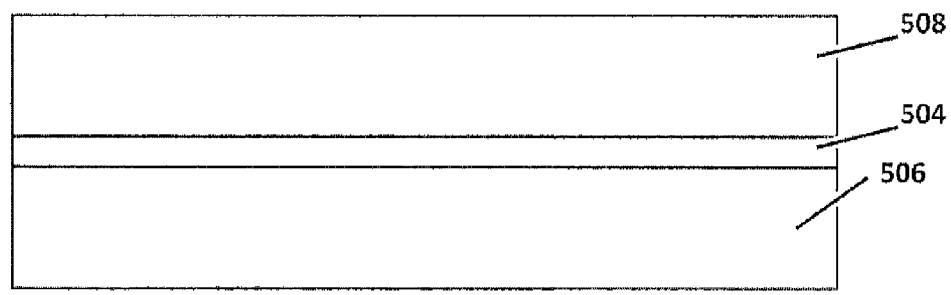

Next, with reference to FIG. 46, a material layer 508 is formed over the common stack layer 504. In one embodiment, the material layer 508 may be oxide, nitride, etc., and may be formed by deposition methods.

Figure 47:
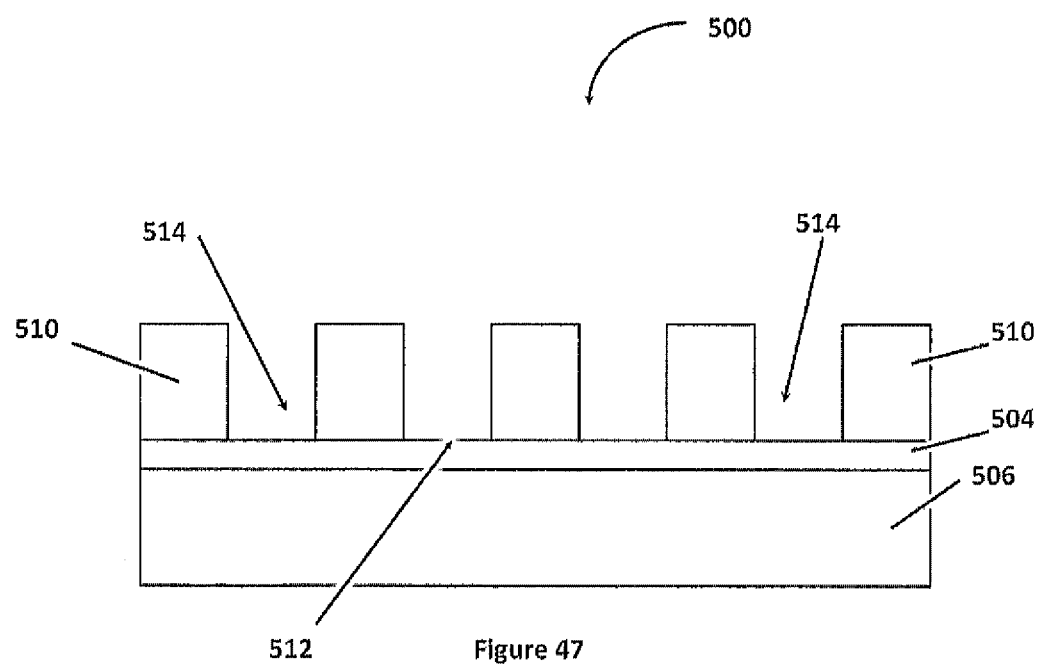

Next, with reference to FIG. 47, patterning the material layer 508 into at least one patterned material structure 510 is performed. The patterning may be performed by etching material layer 508 to define at least one trench 514 and a channel layer top surface 512. In one embodiment, the etching may be performed by plasma-based processing, leaving the patterned material 510.

Figure 48:
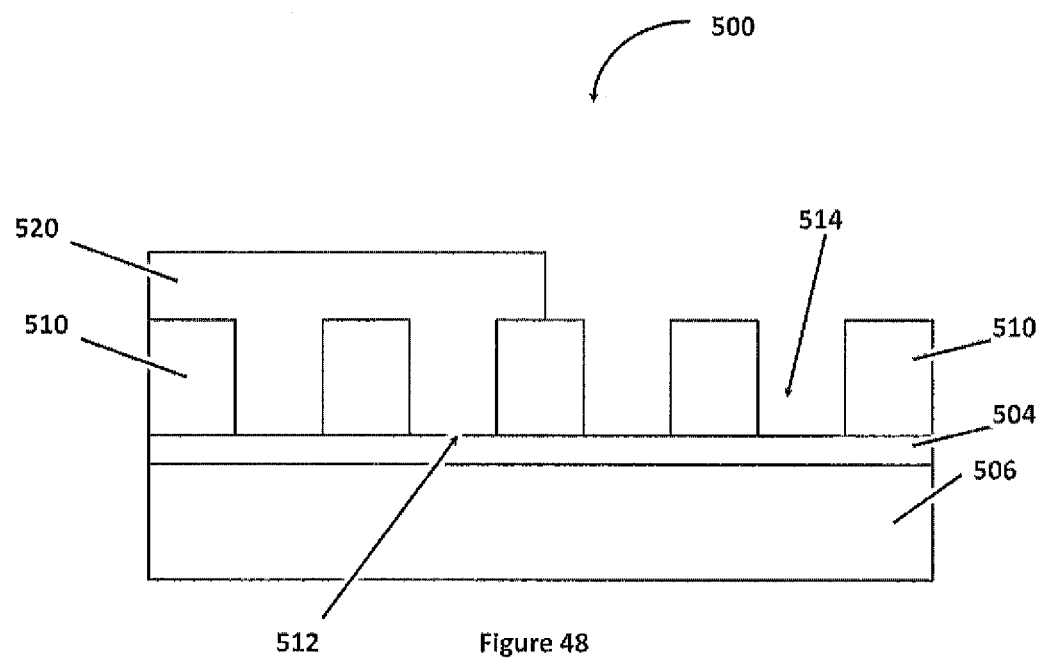

Next, with reference to FIG. 48, a first masking material 520 is formed on a first portion of the common stack layer 504 and a first portion of the at least one patterned material structure 510 proximate the first portion of the common stack layer 504. In one embodiment, forming of the first masking material 520 may include depositing and patterning the first masking material 520. The first masking material 520 may be a pFET masking material, for example Si$_3$N$_4$, TiN, SiO$_2$, etc.

Figure 49:
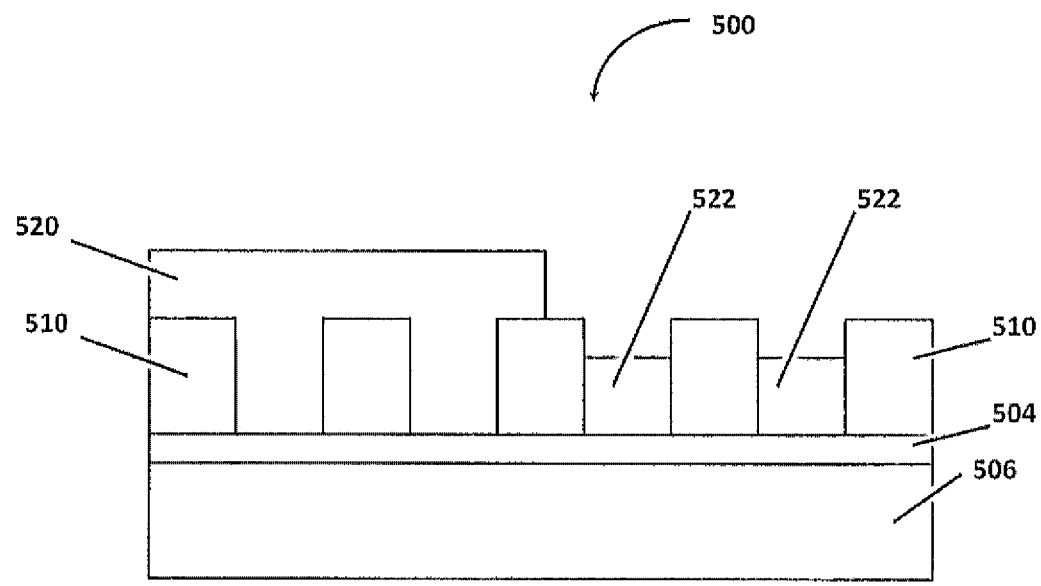

Next, with reference to FIG. 49, a first channel material 522 is formed on a second portion of the common stack layer 504. In one embodiment, the first channel material 522 may be formed by epitaxially growing the first channel material 522. The first channel material 522 may be an nFET channel material, for example Si, uniquely doped Si, etc. In one embodiment, the first channel material 522 may be 40-60 nm thick.

Figure 50:
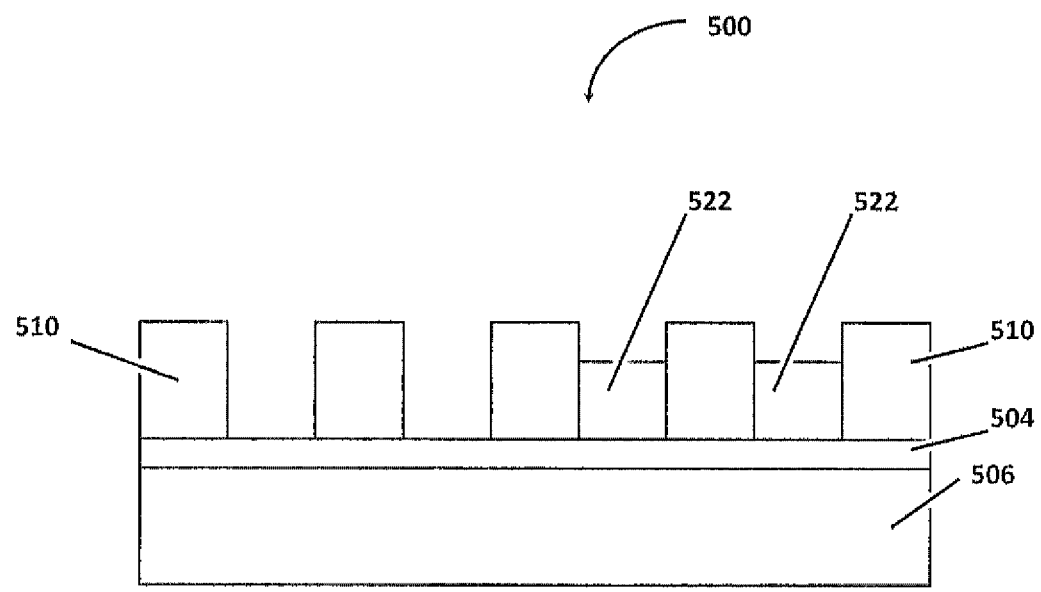

Next, with reference to FIG. 50, removal of the first masking material 520 is performed. In one embodiment, removal may be performed by "wet" chemical methods.

Figure 51:
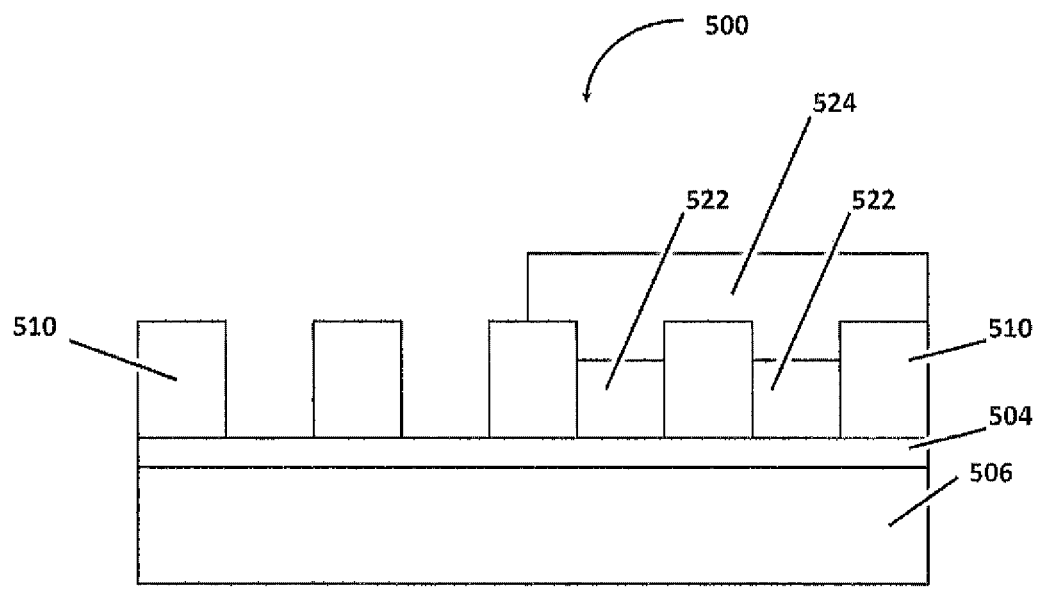

Next, with reference to FIG. 51, a second masking material 524 is formed on the first channel material 522 and a second portion of the at least one patterned material structure 510 proximate to the first channel material 522. In one embodiment, forming the second masking material 524 may be performed by depositing and patterning the second masking material 524. In one embodiment, the masking material 524 may be an nFET masking material, such as Si$_3$N$_4$, TiN, SiO$_2$, etc.

Figure 52:
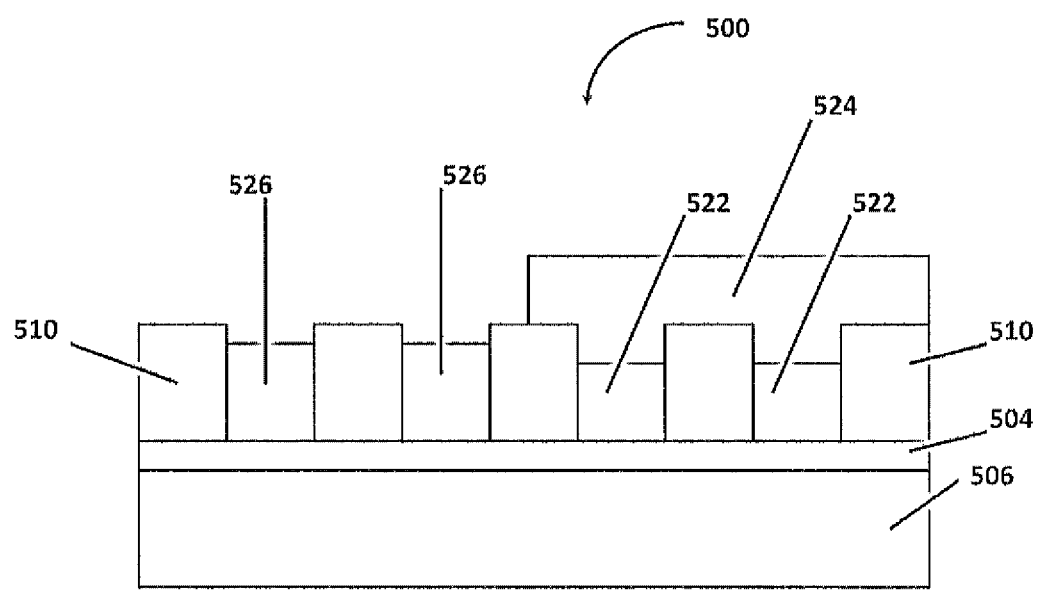

Next, with reference to FIG. 52, a second channel material 526 is formed on the first portion of the common stack layer 504. The second channel material 526 is formed to a height different from that of the first channel material 522. In one embodiment, forming the second channel material 526 may be performed by epitaxially growing the second channel material 526. The second channel material 526 may be a pFET channel material and, for example, have a Ge content in the range of 25-100%. In one embodiment, the second channel material 526 may be 40-60 nm thick.

Figure 53:
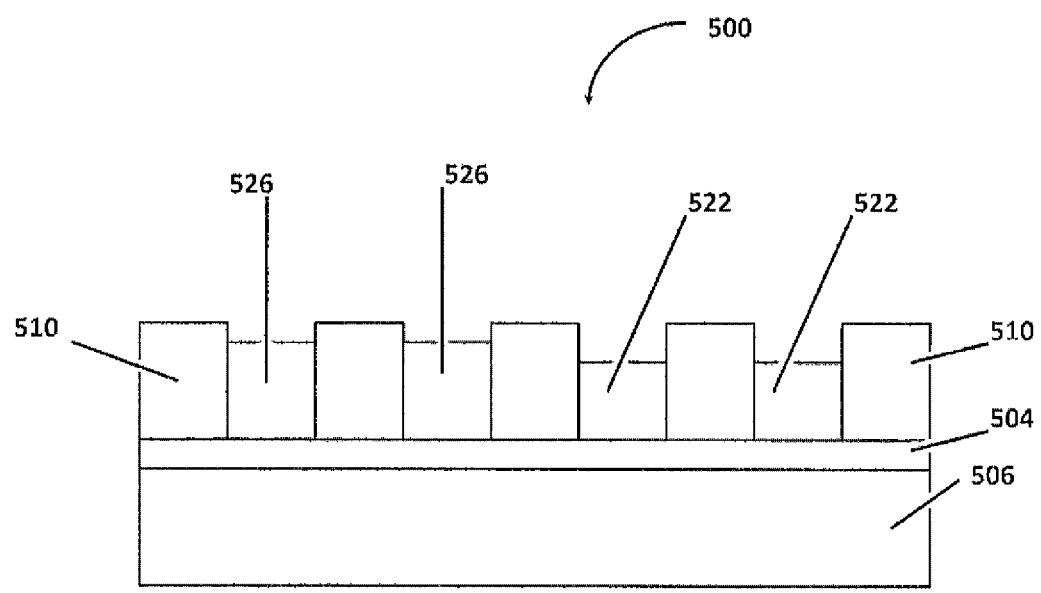

Next, with reference to FIG. 53, removal of the second masking material 524 is performed. In one embodiment, removal of the second masking material 524 may be performed by "wet" chemical etching methods.

Next, with reference to FIG. 54, recessing the at least one patterned material structure 510 is performed to produce recessed structure 530, thereby producing an asymmetry between various recessed structure 526 and 522 heights 540.

In one embodiment, the recessing may be performed by conventional plasma or wet etching methods. In one embodiment, recessed structure 530 may be produced by recessing the patterned material 510 to a depth range of 25-40 nm.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention.

While at least one exemplary embodiment has been presented in the foregoing detailed description, it should be appreciated that a vast number of variations exist. It should also be appreciated that the exemplary embodiment or embodiments described herein are not intended to limit the scope, applicability or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, the protection sought herein is as set forth in the claims below.

What is claimed:

1. A method, comprising:
   providing a substrate, the substrate having a top surface;
   forming a common stack material on the substrate top surface;
   forming a material layer on the common stack material;
   patterning the material layer, thereby defining a plurality of trenches and a plurality of patterned material structures;
   forming a first masking material in a first portion of the plurality of trenches and on a first portion of the plurality of patterned material structures, proximate the first portion of the plurality of trenches;
   forming a first channel material in a second portion of the plurality of trenches;
   removing the first masking material;
   forming a second masking material on the first channel material and on a second portion of the plurality of patterned material structures, proximate the first channel material;
   forming a second channel material in the first portion of the plurality of trenches;
   recessing the first portion of the patterned material structures, creating an asymmetry in the height across the plurality of patterned material structures;
   removing the second masking material; and
   recessing the plurality of patterned material structures.

2. The method of claim 1, wherein forming the common stack material comprises forming the common stack material on the substrate top surface only in the plurality of trenches.

3. The method of claim 2, wherein forming the second channel material comprises forming the second channel material to a height different from the height of the first channel material.

4. The method of claim 1, wherein forming the second channel material comprises forming the second channel material to a height different from the height of the first channel material.

5. The method of claim 1, further comprising recessing the second portion of the plurality of patterned material structures prior to removing the first masking material.

6. The method of claim 1, wherein the first portion of the plurality of patterned material structures and the second portion of the plurality of patterned material structures define different logic and SRAM areas.

7. The method of claim 1, wherein the first masking material is a pFET masking material, the second masking material is an nFET masking material, the first channel material is an nFET channel material, and the second channel material is a pFET channel material.

8. The method of claim 7, wherein the method of forming the first channel material comprises epitaxially growing the first channel material, and the method of forming the second channel material comprises epitaxially growing the second channel material.

9. The method of claim 7 wherein recessing the plurality of patterned material structures allows the first channel material and the second channel material to protrude above the plurality of patterned material structures.

10. The method of claim 1, wherein recessing the first portion of the patterned material structures and recessing the plurality of patterned material structures is performed by plasma-based processing, sublimation-based processing, or wet chemical methods.

11. The method of claim 1, wherein the first portion of the plurality of trenches and the first portion of the plurality of patterned material structures, proximate the first portion of the plurality of trenches, define at least one library cell.

12. The method of claim 1 wherein the first channel material and the second channel material are different.

13. A method, comprising:
    providing a substrate;
    applying a first masking material to the substrate;
    patterning the first masking material, thereby defining a patterned masking material, the patterned masking material having a top surface;
    etching the substrate, thereby defining a plurality of first trenches in a first region of said substrate and a plurality of second trenches in a second region of said substrate;
    forming a material layer at least in the pluralities of first and second trenches;
    forming a second masking material above the material layer, said second masking material exposing said first region and covering said second region of said substrate;
    removing a first portion of the material layer from above said first trenches in said first region while covering said second trenches in said second region with said second masking material;
    removing the second masking material;
    after removing the second masking material, removing a second portion of the material layer from each of said first and second trenches; and
    after removing said second portion of the material layer, removing the patterned masking material.

14. The method of claim 13, wherein forming the material layer comprises forming the material layer to a height above the height of the patterned masking material, and the material layer covers the top surface of the patterned masking material.

15. The method of claim 13, wherein the first masking material is selected from the group consisting of $Si_3N_4$, $SiO_2$ or a dielectric with etch contrast to the substrate, and the second masking material is selected from the group consisting of TiN, SiN, photoresist, OPL, aC, or $SiO_2$.

16. The method of claim 13 wherein removing said second portion of the material layer from said first and second trenches comprises forming a first recessed structure in each of said first trenches and forming a second recessed structure in each of said second trenches.

17. The method of claim 16, wherein a height of each of said first recessed structures is less than a height of each of said second recessed structures.

18. The method of claim 17 wherein said heights of said first and second recessed structures are determined relative to a bottom surface of the respective first and second trenches.

19. A method, comprising:
providing a substrate, the substrate having a top surface;
forming a common stack material on the substrate top surface;
forming a material layer on the common stack material;
patterning the material layer, thereby defining a plurality of trenches and a plurality of patterned material structures;
forming a first masking material in a first portion of the plurality of trenches and on a first portion of the plurality of patterned material structures, proximate the first portion of the plurality of trenches;
forming a first channel material in a second portion of the plurality of trenches;
removing the first masking material;
forming a second masking material on the first channel material and on a second portion of the plurality of patterned material structures, proximate the first channel material;
forming a second channel material in the first portion of the plurality of trenches, forming the second channel material to a height different from the height of the first channel material;
removing the second masking material; and
recessing the plurality of patterned material structures.

20. The method of claim 19, wherein forming the common stack material comprises forming the common stack material on the substrate top surface only in the plurality of trenches.

21. The method of claim 19, wherein the first portion of the plurality of patterned material structures and the second portion of the plurality of patterned material structures define different logic and SRAM areas.

22. The method of claim 19, wherein the first masking material is a pFET masking material, the second masking material is an nFET masking material, the first channel material is an nFET channel material, and the second channel material is a pFET channel material.

23. The method of claim 22 wherein recessing the plurality of patterned material structures allows the first channel material and the second channel material to protrude above the plurality of patterned material structures.

* * * * *